US012633907B2

(12) United States Patent　　　　　(10) Patent No.: US 12,633,907 B2
Choi　　　　　　　　　　　　　　　　　(45) Date of Patent: May 19, 2026

(54) MEMORY DEVICE, MEMORY SYSTEM HAVING THE SAME, AND OPERATING METHOD THEREOF

(71) Applicant: Samsung Electronics Co., Ltd., Suwon-si (KR)

(72) Inventor: Yoonjae Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 55 days.

(21) Appl. No.: 18/754,433

(22) Filed: Jun. 26, 2024

(65) Prior Publication Data

US 2025/0247084 A1　　Jul. 31, 2025

(30) Foreign Application Priority Data

Jan. 25, 2024　　(KR) ........................ 10-2024-0011415

(51) Int. Cl.
| | |
|---|---|
| *G11C 16/04* | (2006.01) |
| *H03K 5/14* | (2014.01) |
| *H03K 5/24* | (2006.01) |
| *H03K 19/173* | (2006.01) |

(52) U.S. Cl.
CPC ............... *H03K 5/14* (2013.01); *H03K 5/249* (2013.01); *H03K 19/1737* (2013.01)

(58) Field of Classification Search
CPC ....... H03K 5/14; H03K 5/249; H03K 19/1737
See application file for complete search history.

(56) References Cited

U.S. PATENT DOCUMENTS

| | | | |
|---|---|---|---|
| 9,166,774 B2 | 10/2015 | Zhong | |
| 9,654,133 B2 | 5/2017 | Speir et al. | |
| 10,972,108 B1 * | 4/2021 | Li ......................... | H03L 7/0812 |
| 11,012,201 B2 | 5/2021 | Hormis et al. | |
| 11,057,039 B1 * | 7/2021 | Kossel ................. | H03K 21/026 |
| 11,742,016 B2 * | 8/2023 | Yoon ...................... | G11C 7/222 |
| | | | 365/149 |
| 2005/0281325 A1 | 12/2005 | Lillo et al. | |
| 2022/0343957 A1 | 10/2022 | Yoon et al. | |
| 2023/0110301 A1 | 4/2023 | Rie et al. | |
| 2023/0360689 A1 | 11/2023 | Park et al. | |
| 2024/0187002 A1 | 6/2024 | Lee et al. | |

FOREIGN PATENT DOCUMENTS

KR　　10-2022-0166244 A　　12/2022

OTHER PUBLICATIONS

YongJo Kim, et al. "A 2.3-mW 0.01-mm2 1.25-GHz Quadrature Signal Corrector With 1.1-ps Error for Mobile DRAM Interface in 65-nm CMOS", IEEE Transactions On Circuits and Systems-II: Express Briefs, vol. 64, No. 4, Apr. 2017. pp. 397-401.
Extended European Search Report dated Dec. 12, 2024 for corresponding European Application No. 24193925.5.

* cited by examiner

*Primary Examiner* — Pho M Luu
(74) *Attorney, Agent, or Firm* — Fish & Richardson P.C.

(57) ABSTRACT
A method of operating a memory device includes receiving a quadrature clock and performing quadrature error correction of the quadrature clock in a non-sequential scheme, wherein the quadrature clock includes a first clock, a second clock, a third clock, and a fourth clock, having a sequential phase.

20 Claims, 18 Drawing Sheets

S110

Receive quadrature clock

S120

Perform quadrature error correction
using non-sequential scheme

10

12

HOST

CMD

ADDR

CLKI

CLKQ

DQ

11

MEMORY DEVICE 11-2

LOGIC
CIRCUIT 11-1

BANK
REGION

MEMORY DEVICE, MEMORY SYSTEM HAVING THE SAME, AND OPERATING METHOD THEREOF

CROSS-REFERENCE TO RELATED APPLICATION(S)

This application claims benefit of priority to Korean Patent Application No. 10-2024-0011415 filed on Jan. 25, 2024 in the Korean Intellectual Property Office, the disclosure of which is incorporated herein by reference in its entirety.

BACKGROUND

The present inventive concepts relate to memory devices, memory systems having the same, and operating methods thereof.

In general, a 4-phase clock (quadrature clock) may be a clock used in memory devices and other digital systems. The 4-phase clock indicates time, and may be mainly used to control and synchronize a transmission and storage speed of data. This may be a clock periodically variable, and may have four states (for example, 0°, 90°, 180°, and) 270° during one cycle. When the 4-phase clock is used, data may be transmitted or stored at a faster rate. This clock may contribute to accurately control timing of transmission and storage of data, and synchronize with other system components. A cycle and phase of the 4-phase clock should be preserved, otherwise errors may occur in transmission and storage of data. For this, the 4-phase clock should occur and be corrected in a clock generator and a distributor. Phase correction of the clock may be mainly performed using a feedback loop. In this loop, the clock may be measured and compared to adjust a signal. A phase correction algorithm may be used to accurately adjust the clock to 0°, 90°, 180°, and 270°. The phase correction of the clock may correct fine errors or delays of cycles, to maintain accurate timing of data and prevent occurrence of errors. When data is stably transmitted or stored using the 4-phase clock, integrity and reliability of the data may be improved. Data loss or error may be minimized to improve performance of a system.

SUMMARY

Some aspects of the present inventive concepts are to provide memory devices performing new quadrature error correction, memory systems having the same, and operating methods thereof.

Some aspects of the present inventive concepts are to provide memory devices performing quadrature error correction at a faster rate while reducing a chip size, memory systems having the same, and operating methods thereof.

According to some aspects of the present inventive concepts, a method of operating a memory device includes receiving a first clock, a second clock, a third clock, and a fourth clock, having a sequential phase difference; updating a first delay code corresponding to a first delay line while detecting a first phase difference between the third clock and the fourth clock during a first clock cycle; updating a fourth delay code corresponding to a fourth delay line according to the first phase difference while detecting a second phase difference between the second clock and the third clock during a second clock cycle; updating a third delay code corresponding to a third delay line according to the second phase difference while detecting a third phase difference between the first clock and the second clock during a third clock cycle; updating a second delay code corresponding to the fourth delay line according to the third phase difference during a fourth clock cycle; and detecting a fourth phase difference between the fourth clock and the first clock during a fifth clock cycle.

According to some aspects of the present inventive concepts, a memory device includes a first clock line, a second clock line, a third clock line, and a fourth clock line, respectively outputting a first clock, a second clock, a third clock, and a fourth clock, having a sequential phase difference; a multiplexer selecting a first clock output signal and a second clock output signal from the first to fourth clock lines in response to a select signal; a first delay line configured to receive the first clock output signal; a second delay line configured to receive the second clock; a third delay line configured to receive the third clock; a fourth delay line configured to receive the fourth clock; a phase detector configured to detect a phase difference between a clock delayed through the first delay line and a clock of the second clock output signal; and a digital logic configured to generate a delay code corresponding to the phase difference and control a delay line corresponding to the delay code, among the first to four delay lines, the digital logic configured to generate the select signal to select two clocks, among the first to fourth clocks, in a non-sequential scheme.

According to some aspects of the present inventive concepts, a memory system includes at least one memory device; and a memory controller configured to control the at least one memory device, the at least one memory device including a memory cell array having memory cells connected to wordlines and bitlines; a quadrature error correction circuit configured to receive a quadrature clock and correct the quadrature clock; a clock generator configured to generate the corrected quadrature clock as an internal clock; and a control logic configured to control write and read operations of the memory cell array, the quadrature error correction circuit configured to correct the quadrature clock in a non-sequential scheme with one phase detector.

According to some aspects of the present inventive concepts, a method of operating a memory device includes receiving a quadrature clock; and performing quadrature error correction of the quadrature clock in a non-sequential scheme, the quadrature clock including a first clock, a second clock, a third clock, and a fourth clock, having a sequential phase.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, the contents of the present inventive concepts will be clearly and in detail using the drawings such that those with ordinary knowledge in the technical field of the present inventive concepts may easily implement the present inventive concepts.

Figure 1:
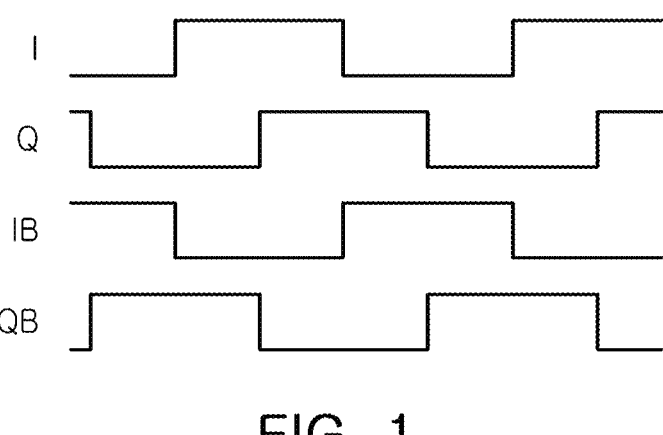
FIG. 1 is a view illustrating a general quadrature clock.

A memory device and an operating method thereof according to some example embodiments of the present inventions may quickly and accurately correct phase errors and be insensitive to mismatches. The memory device of the present inventions may include a delay line, a multiplexer, a bang-bang phase detector (BBPD), a loop filter, and control logic. The memory device and the operating method of the present inventions may correct phase errors non-sequentially and increase loop speed regardless of mismatches. In other words, the memory device of the present inventions may accurately correct phase errors to 0 with fast lock time. The memory device of the present inventions may minimize waiting cycles compared to sequential phase error correction through non-sequential phase error correction. Furthermore, the memory device of the present inventions may achieve faster lock times without mismatch issues compared to using multiple loops by using only one loop. FIG. 1 is a view illustrating a general quadrature clock. A data transmission speed required by a memory interface is continuously increasing. Therefore, a quadrature clock (4-phase clock) may be used to alleviate an increased internal clock frequency according thereto and improve a timing margin. A first clock I, a second clock Q, a third clock IB, and a fourth clock QB, having a sequential phase, are illustrated. Two adjacent clocks among the first clock I, the second clock Q, the third clock IB, and the fourth clock QB may have a 90° phase difference from each other. For example, the first clock I and the second clock Q may have a 90° phase difference, the second clock Q and the third clock IB may have a 90° phase difference, the third clock IB and the fourth clock QB may have a 90° phase difference, and the fourth clock QB and the first clock I may have a 90° phase difference.

In general, a phase error may inevitably occur between quadrature clocks due to a PVT (Process, Voltage, Temperature) variation, a mismatch, etc. of a clock buffer circuit. Since this causes a margin to deteriorate, quadrature error correction (QEC) for correcting a phase clock may be essentially used in an interface using the quadrature clocks. Such QEC may be implemented with an analog circuit or a digital circuit.

Figure 2:
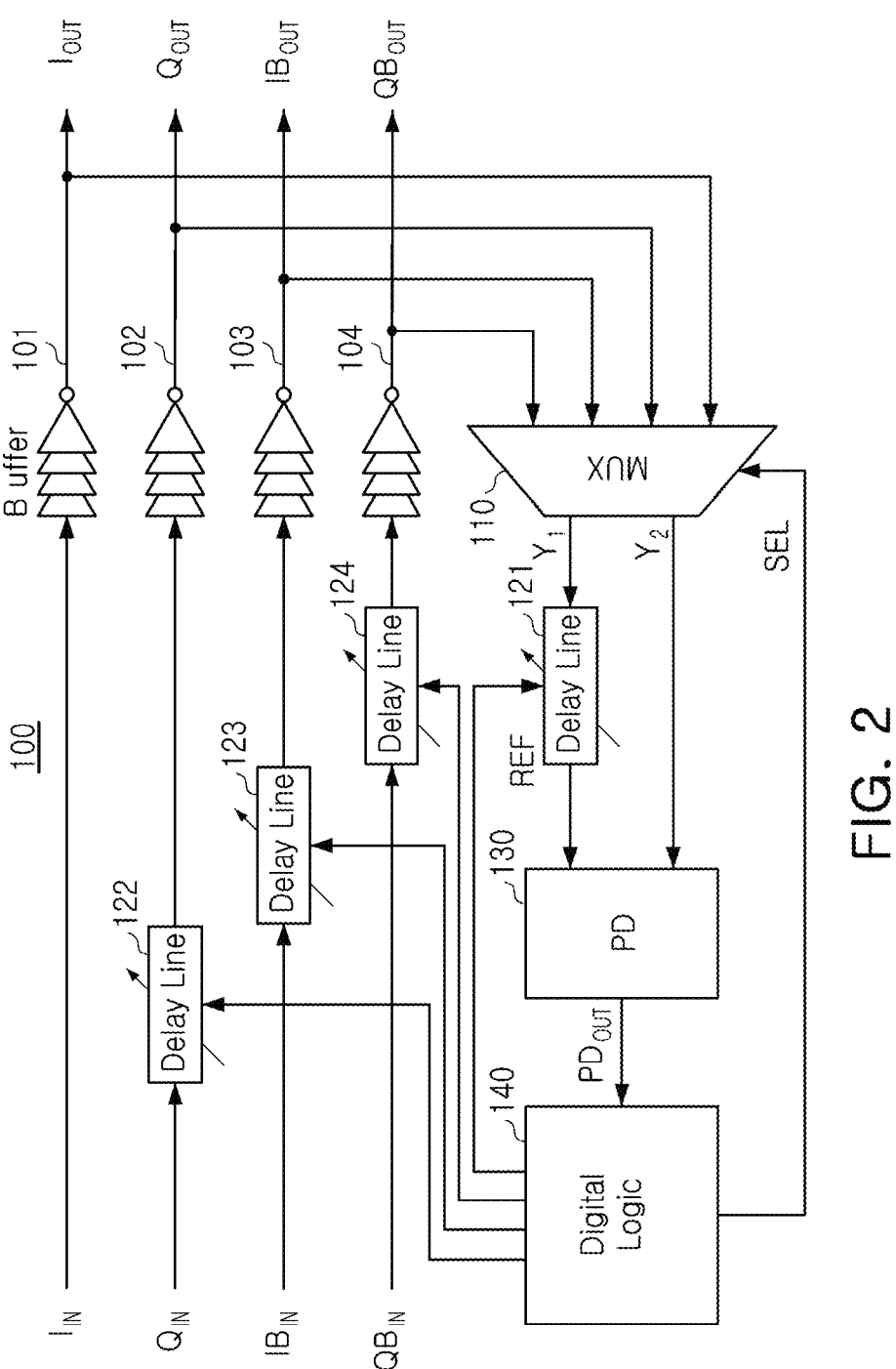
FIG. 2 is a view illustrating a quadrature error correction circuit.

FIG. 2 is a view illustrating a quadrature error correction circuit. Referring to FIG. 2, a quadrature error correction circuit 100 may include clock lines 101 to 104, a multiplexer (MUX) 110, delay lines 121 to 124, a phase detector (PD) 130, and a digital logic 140.

The clock lines 101 to 104 may output a clock $I_{OUT}$, a clock $Q_{OUT}$, a clock $IB_{OUT}$, and a clock $QB_{OUT}$, corresponding thereto and having a sequential phase difference, respectively.

The multiplexer 110 may be implemented to select two of the first to fourth clock lines 101 to 104 in response to a select signal SEL, and to output a first clock output signal $Y_1$ and a second clock output signal $Y_2$, corresponding thereto.

A first delay line (REF) 121 may be implemented to delay the first clock output signal Y, according to a first delay code. In this case, the first delay code may be controlled by the digital logic 140. A second delay line 122 may be implemented to delay a second clock $I_{IN}$ according to a second delay code. The delayed second clock $I_{IN}$ may be output to a second clock line 102 via a buffer. In this case, the second delay code may be controlled by the digital logic 140. A third delay line 123 may be implemented to delay the third clock $IB_{IN}$ according to a third delay code. The delayed third clock $IB_{IN}$ may be output to a third clock line 103 via the buffer. In this case, the third delay code may be controlled by the digital logic 140. A fourth delay line 124 may be implemented to delay the fourth clock $QB_{IN}$ according to a fourth delay code. The delayed fourth clock $QB_{IN}$ may be output to a fourth clock line 104 via the buffer. In this case, the fourth delay code may be controlled by the digital logic 140.

The phase detector 130 may be implemented to detect a phase difference $PD_{OUT}$ between a clock delayed through the first delay line (REF) 121 and a clock of the second clock output signal $Y_2$. In some example embodiments, the phase detector 130 may be implemented as a bang-bang phase detector.

The digital logic 140 may be implemented to generate the select signal SEL to perform a quadrature error correction operation, or to generate first to fourth delay codes corresponding to the phase difference $PD_{OUT}$.

Figure 3:
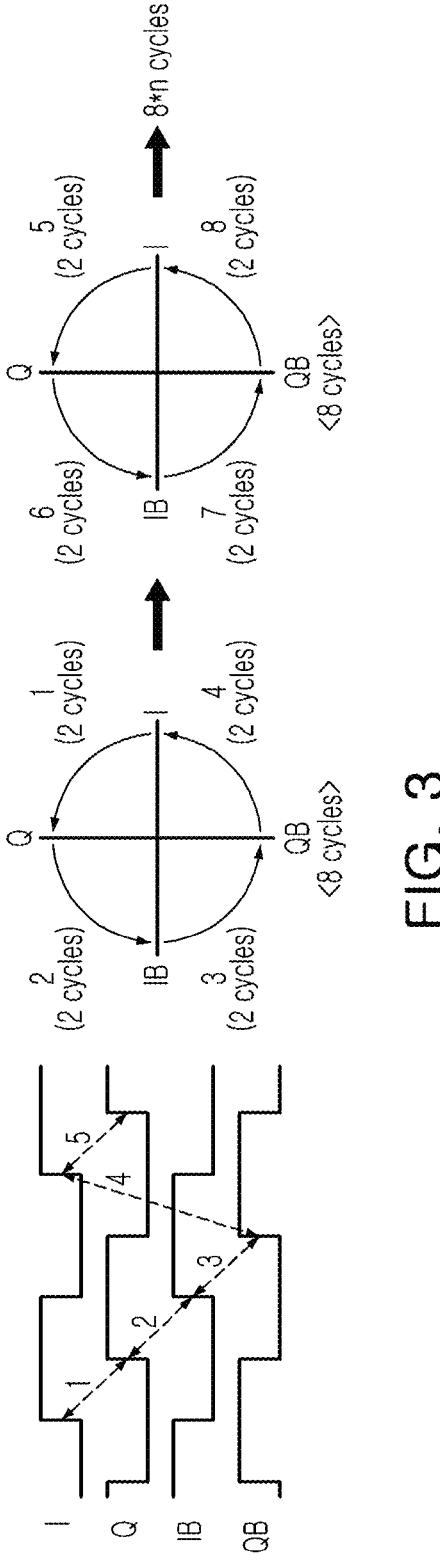
FIG. 3 is a view illustrating a sequential correction operation of a quadrature error correction circuit.

FIG. 3 is a view illustrating a sequential correction operation of a quadrature error correction circuit 100. Referring to FIG. 3, a phase detector 130 may sequentially detect a phase error ($PD_{OUT}$) of two adjacent clocks in the order of $I_{OUT}$-$Q_{OUT}$, $Q_{OUT}$-$IB_{OUT}$, $IB_{OUT}$-$QB_{OUT}$, and $QB_{OUT}$-$I_{OUT}$ according to a control signal of a digital logic 140. The digital logic 140 may generate a delay code according to an output phase difference ($PD_{OUT}$), and may adjust delay lines 121 to 124 of Q, IB, QB, and REF by using the delay code, such that two adjacent clocks may be corrected to have a phase difference of 90°. The quadrature error correction circuit 100 may solve an offset between different phase detectors, generated when using a plurality of phase detectors, by using only one phase detector 130.

As illustrated in FIG. 3, such a sequential algorithm may detect a current phase error to update a delay line code, and may then detect a phase error, subsequent thereto. For example, to detect a phase error of the $Q_{OUT}$-$IB_{OUT}$, a phase error of the $I_{OUT}$-$Q_{OUT}$ may be detected and a delay line code of Q may be updated, and an input delay of the phase detector 130 may be updated via a buffer and a multiplexer 110. Therefore, it may take at least one clock cycle until the input delay of the phase detector 130 is updated through a delay line and the buffer, after the phase error is detected. A minimum of 8 clock cycles may be required for one loop operation. Therefore, it may take a relatively long QEC lock time.

Figure 4:
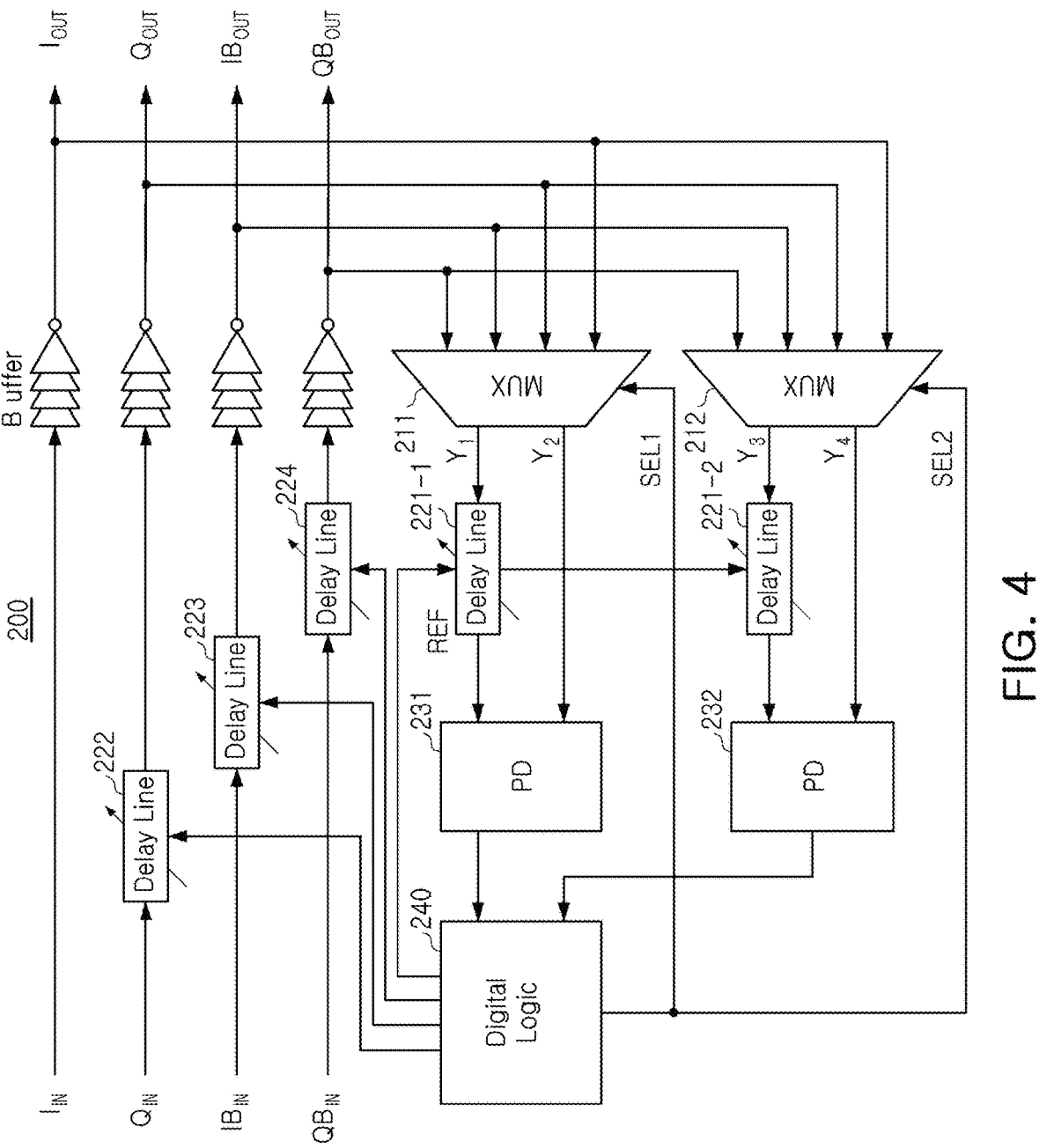
FIG. 4 is a view illustrating a general quadrature error correction circuit.

FIG. 4 is a view illustrating a general quadrature error correction circuit 200. Referring to FIG. 4, a quadrature error correction circuit 200 may include a first multiplexer 211, a second multiplexer 212, delay lines 221-1, 221-2, 223, and 224, a first phase detector 231, a second phase detector 232, and a digital logic 240.

Figure 5:
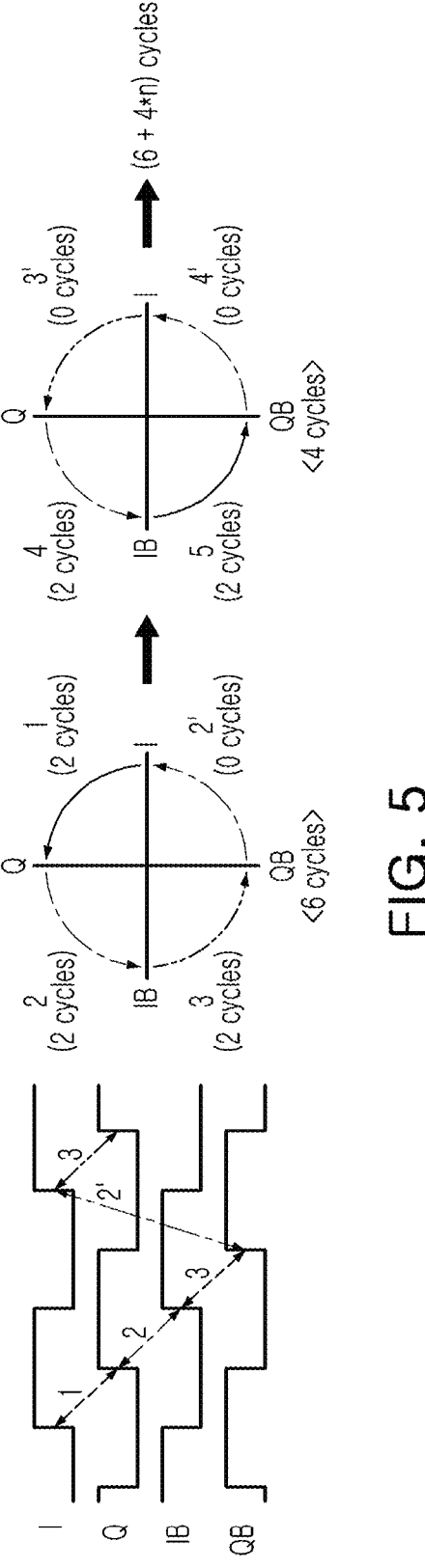
FIG. 5 is a view illustrating an operation of unrolling quadrature error correction of a quadrature error correction circuit.

FIG. 5 is a view illustrating an operation of unrolling QEC of a quadrature error correction circuit 200. As illustrated in FIG. 5, an unrolling technique may be used to reduce a lock time. Phase error detection may simultaneously performed independently of each other, such as I-Q or IB-QB, to significantly reduce a lock time. Assuming that 8 clock cycles are required for a loop operation, as in FIG. 3, a rolling technique, as in FIG. 5, may take 6 clock cycles in a first loop and 4 clock cycles thereafter. As the loop operation increases according to an initial state, the lock time may converge to ½, as compared to that in FIG. 3. As illustrated in FIG. 5, two phase detectors 231 and 232 and a loop may be used for an unrolling operation. This may cause an offset problem.

A quadrature error correction circuit according to some example embodiments may detect a phase error in a non-sequential scheme, with one phase detector, to reduce an offset problem while reducing a lock time.

Figure 6:
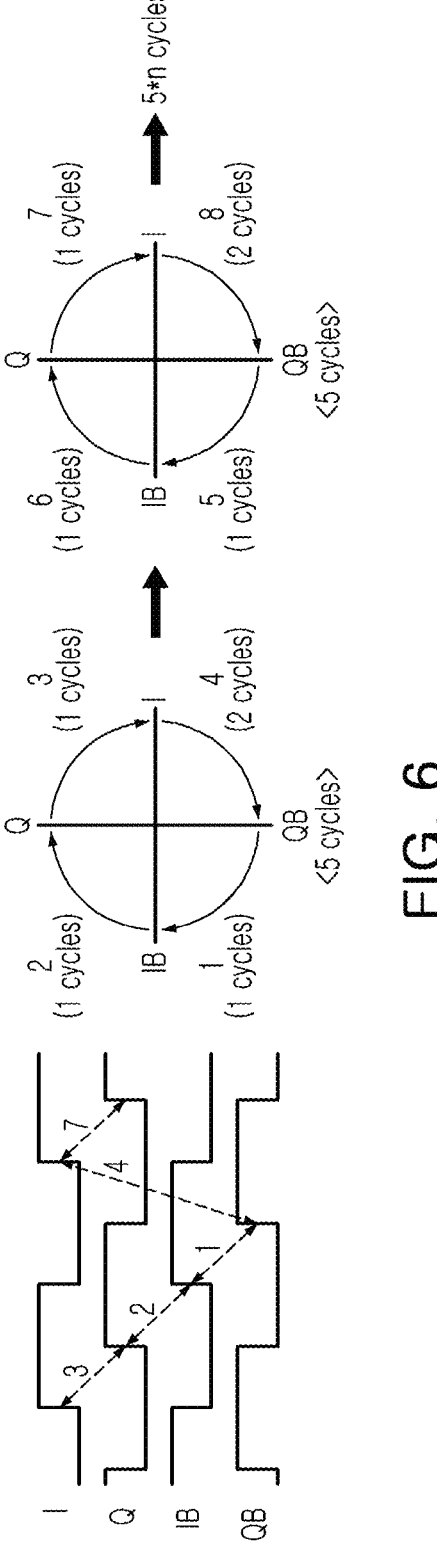
FIG. 6 is a view illustrating a quadrature error correction operation in a non-sequential scheme according to some example embodiments.

FIG. 6 is a view illustrating a quadrature error correction operation in a non-sequential scheme in the quadrature error correction circuit 100 of FIG. 2. As illustrated in FIG. 6, a lock time of the quadrature error correction circuit 100 of FIG. 2 may be significantly improved by using a non-sequential algorithm.

The phase detector 130 may detect a phase error of two adjacent clocks in the order of $IB_{OUT}$-$QB_{OUT}$, $Q_{OUT}$-$IB_{OUT}$, $I_{OUT}$-$Q_{OUT}$, and $QB_{OUT}$-$I_{OUT}$ according to a control signal of the digital logic 140, may generate a delay code according to the detected phase error, and may control/regulate/adjust the delay lines 122, 123, and 123 of QB, IB, and Q according to the delay code. Such a non-sequential scheme does not require waiting for an update of a previous delay line code at the next detection of a phase error. For example, a phase error of the $IB_{OUT}$-$QB_{OUT}$ may be detected, and a delay line code of the QB may be updated. While the delay may be updated through a buffer, phase detection of the $Q_{OUT}$-$IB_{OUT}$ independent of the QB may be simultaneously performed. Therefore, a separate clock cycle for updating the delay line may not be required.

One clock among the four clocks I, Q, IB, and QB may be used as a clock of the digital logic. Since a timing margin of one of the four phase detection operations of $IB_{OUT}$-$QB_{OUT}$, $Q_{OUT}$-$IB_{OUT}$, $I_{OUT}$-$Q_{OUT}$, and $QB_{OUT}$-$I_{OUT}$ is insufficient, depending on a type of clock, in one operation, one clock cycle may be additionally used to secure a margin. For example, when the QB is used as a clock of the digital logic 140, since a timing margin is insufficient to update the reference delay line 121 in a period ranging from phase error detection of the $QB_{OUT}$-$I_{OUT}$ to phase error detection of the $I_{OUT}$-$Q_{OUT}$, one clock cycle may be additionally used to update the reference delay line 121 in a loop to secure a margin.

Figure 7:
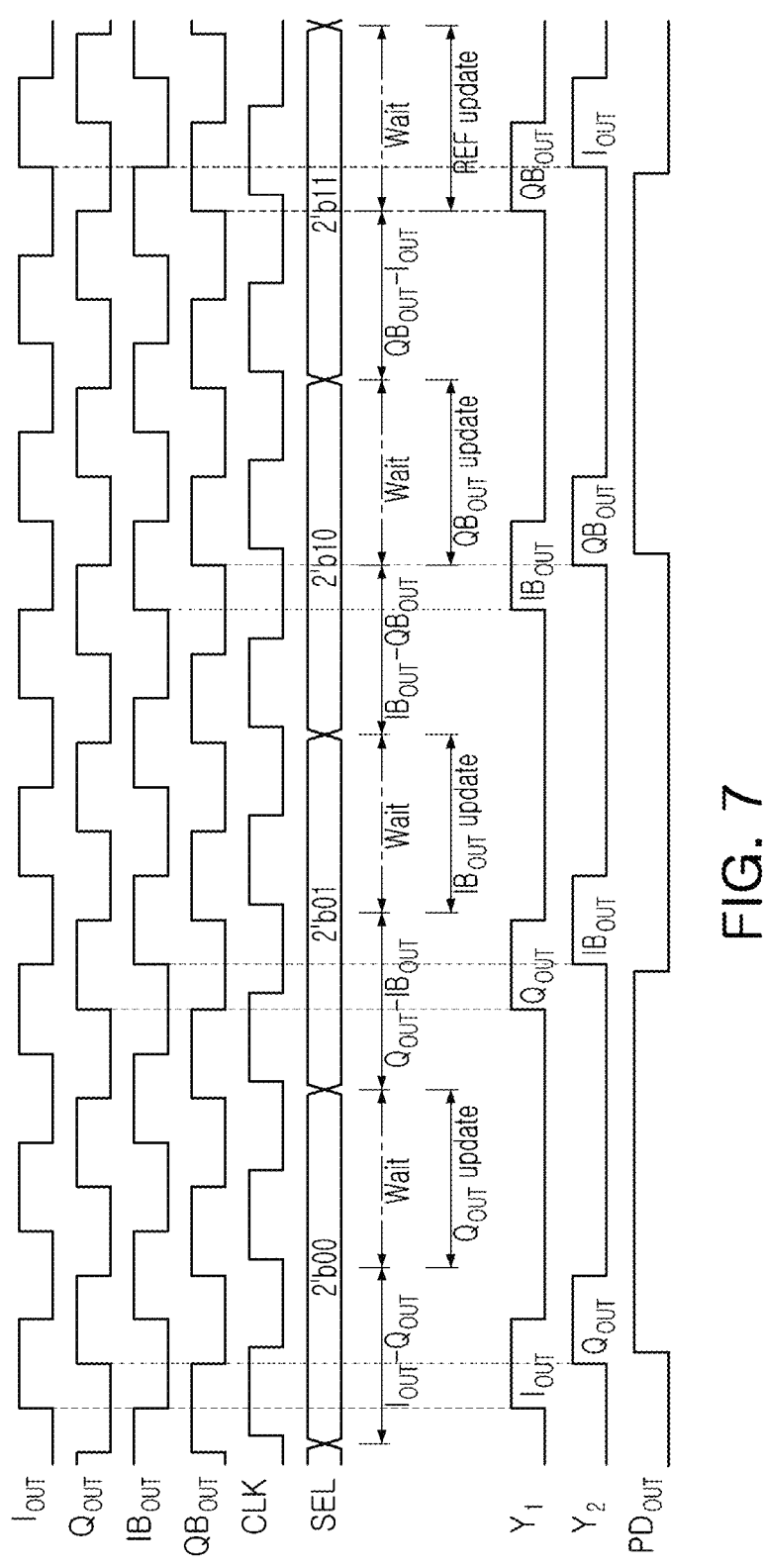
FIG. 7 is a view illustrating timing of a quadrature error correction operation performed in a general sequential scheme.

FIG. 7 is a view illustrating timing of a quadrature error correction operation performed in a general sequential scheme. As illustrated in FIG. 7, phase errors between adjacent clocks may be sequentially corrected. For example, a phase error of $I_{OUT}$-$Q_{OUT}$ may be detected, a delay code of a delay line corresponding to the $Q_{OUT}$ may be updated, a phase error of $Q_{OUT}$-$IB_{OUT}$ may be detected, a delay code of a delay line corresponding to the $IB_{OUT}$ may be updated, a phase error of $IB_{OUT}$-$QB_{OUT}$ may be detected, a delay code of a delay line corresponding to the $QB_{OUT}$ may be updated, a phase error of $QB_{OUT}$-$I_{OUT}$ may be detected, and a delay code of a reference delay line corresponding to REF may be updated.

Figure 8:
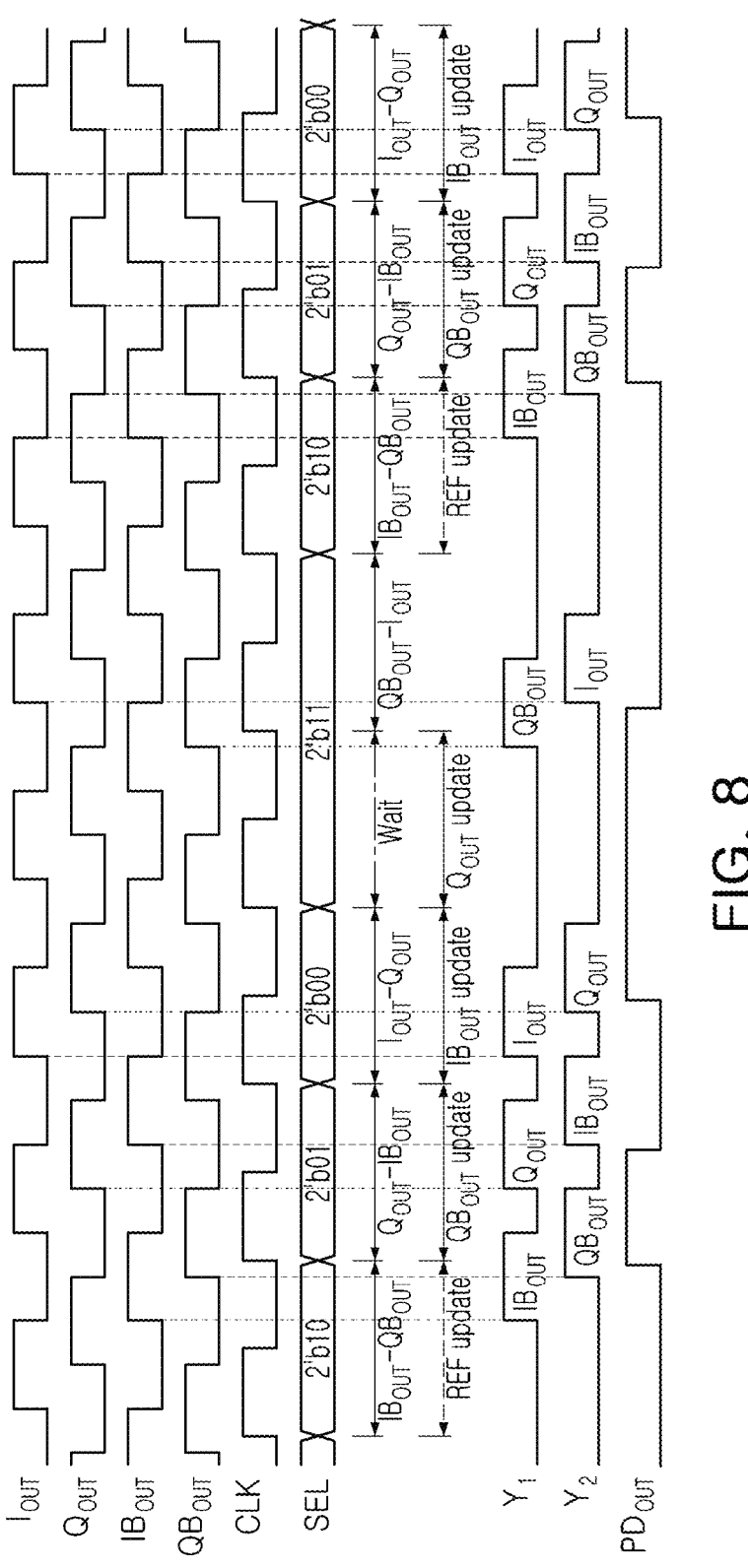
FIG. 8 is a view illustrating timing of a quadrature error correction operation performed in a non-sequential scheme according to some example embodiments.

FIG. 8 is a view illustrating timing of a quadrature error correction operation performed in a non-sequential scheme according to some example embodiments. Referring to FIG. 8, a quadrature error correction operation may be performed in the following order.

A phase error (e.g., a first phase difference) of $IB_{OUT}$-$QB_{OUT}$ may be detected during a first clock cycle, and a first delay code of a reference delay line (e.g., REF and 121, see FIG. 2) may be updated, at the same time. Then, a phase error (e.g., a second phase difference) of $Q_{OUT}$-$IB_{OUT}$ may be detected during a second clock cycle, and a fourth delay code of a delay line (e.g., 124, see FIG. 2) corresponding to $QB_{OUT}$ may be updated according to the phase error (e.g., the first phase difference) of the $IB_{OUT}$-$QB_{OUT}$ detected at the same time. Then, a phase error (e.g., a third phase difference) of $J_{OUR}$-$Q_{OUT}$ may be detected during a third clock cycle, and a delay line (e.g., 123, see FIG. 2) corresponding to $IB_{OUT}$ (e.g., see FIG. 2) may be updated according to the phase error (e.g., the second phase difference) of the $Q_{OUT}$-$IB_{OUT}$ detected at the same time. Then, phase error detection during a fourth clock cycle may wait during a 1-clock cycle, and the delay line (e.g., 124, see FIG. 2) corresponding to $Q_{OUT}$ may be updated according to the phase error (e.g., the third phase difference) of the $I_{OUT}$-$Q_{OUT}$ detected at the same time. Then, a phase error (e.g., a fourth phase difference) of $QB_{OUT}$-$I_{OUT}$ may be detected during a fifth clock cycle. Then, the above-described processes may be repeated. The phase error of the $IB_{OUT}$-$QB_{OUT}$ may be detected and the reference delay line may be updated, at the same time.

In some example embodiments, a first clock $I_{OUT}$, a second clock $Q_{OUT}$, a third clock $IB_{OUT}$, and a fourth clock $QB_{OUT}$ may be quadrature clocks having a sequential phase difference of 90°.

In some example embodiments, the third clock $IB_{OUT}$ and the fourth clock $QB_{OUT}$ may be selected during the first clock cycle in response to a select signal SEL=2'b10, and the first phase difference between the third clock $IB_{OUT}$ and the fourth clock $QB_{OUT}$ may be output. In some example embodiments, the second clock $Q_{OUT}$ and the third clock $IB_{OUT}$ may be selected during the second clock cycle in response to a select signal SEL=2'b01, and the second phase difference between the second clock $Q_{OUT}$ and the third clock $IB_{OUT}$ may be output. In some example embodiments, the first clock $I_{OUT}$ and the second clock $Q_{OUT}$ may be selected during the third clock cycle in response to a select signal SEL=2'b00, and the third phase difference between the first clock $J_{OUR}$ and the second clock $Q_{OUT}$ may be output. In some example embodiments, detection of a clock phase difference may wait during the fourth clock cycle in response to a select signal SEL=2'b11. In some example embodiments, the fourth clock $QB_{OUT}$ and the first clock $I_{OUT}$ may be selected during the fifth clock cycle while the select signal SEL=2'b11 is maintained, and a fourth phase difference between the fourth clock $QB_{OUT}$ and the first clock $I_{OUT}$ may be output. In some example embodiments, after detecting the fourth phase difference, the first delay code for controlling delay of a first delay line may be updated according to the fourth phase difference.

In some example embodiments, two clock output signals Y1 and Y2 may be selected from among the first to fourth clocks $I_{OUT}$, $Q_{OUT}$, $IB_{OUT}$, and $QB_{OUT}$ by a multiplexer 110 (see FIG. 2).

When QEC is implemented using a non-sequential algorithm according to some example embodiments, a lock time may be improved by ⅝ without an offset problem of a phase detector 130, as compared to a sequential scheme. Such a lock time improvement effect may be increased as a clock cycle used for updating may be increased due to an extended clock buffer. A quadrature error correction circuit according to some example embodiments may (for example, significantly) improve a lock time without (for example, significantly) changing structures of a general dynamic random access memory (DRAM) interface and an input/output (I/O). For example, according to some example embodiments, there may be an increase in speed, accuracy, device longevity, and/or power efficiency of the storage device based on the above methods. Therefore, the improved devices and methods overcome the deficiencies of the conventional devices and methods of operating storage devices while reducing resource consumption, device longevity, data accuracy, and increasing output.

Figure 9:
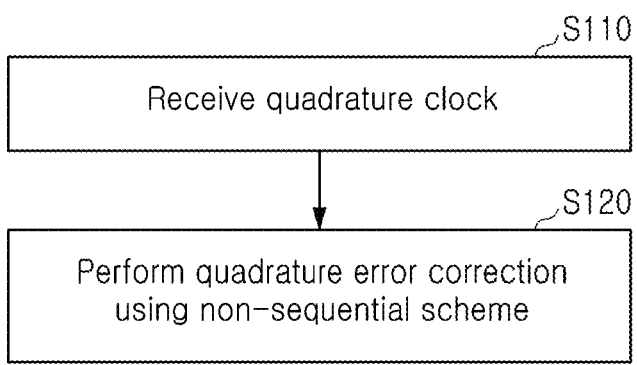
FIG. 9 is a flowchart illustrating an operation of a quadrature error correction circuit according to some example embodiments.

FIG. 9 is a flowchart illustrating an operation of a quadrature error correction circuit according to some example embodiments. Referring to FIGS. 1 to 9, a quadrature error correction circuit may perform a quadrature error correction operation as follows. A quadrature error correction circuit 100 may receive a quadrature clock (S110). In this case, the quadrature clock may include a first clock I, a second clock Q, a third clock IB, and a fourth clock QB, having a sequential phase. The quadrature error correction circuit 100 may perform quadrature error correction in a non-sequential scheme (S120).

In some example embodiments, a clock may be received from an external device (e.g., a memory controller), and a quadrature clock may be generated using the clock. In some example embodiments, the quadrature error correction may be performed during five clock cycles.

In some example embodiments, the quadrature error correction operation may perform an operation of updating a first delay code corresponding to a first delay line while detecting a first phase difference between the third clock IB and the fourth clock QB during a first clock cycle; an operation of updating a fourth delay code corresponding to a fourth delay line according to the first phase difference while detecting a second phase difference between the second clock Q and the third clock IB during a second clock cycle; an operation of updating a third delay code corresponding to a third delay line according to the second phase difference while detecting a third phase difference between the first clock I and the second clock Q during a third clock cycle; an operation of updating a second delay code corresponding to the fourth delay line according to the third phase difference during a fourth clock cycle; and an operation of detecting a fourth phase difference between the fourth clock QB and the first clock I during a fifth clock cycle. In some example embodiments, an operation of detecting a phase difference during the fourth clock cycle may be on a wait.

Figure 10:
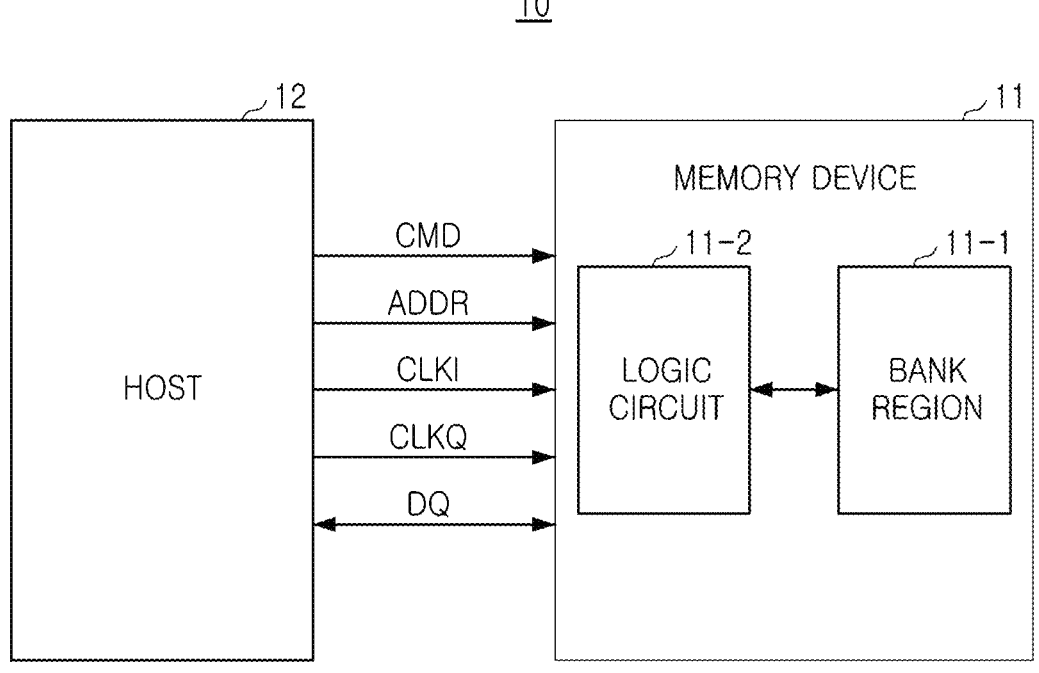
FIG. 10 is a view illustrating a memory system 10 according to some example embodiments.

FIG. 10 is a view illustrating a memory system 10 according to some example embodiments. Referring to FIG. 10, a memory system 10 may include a memory device 11 and a host device 12.

The memory device 11 may include a bank region 11-1 and a logic circuit 11-2. The logic circuit 11-2 may include a transmission circuit outputting a data signal DQ to the host device 12, and a reception circuit receiving the data signal DQ, a command signal CMD, an address signal ADDR, etc. from the host device 12. Also, the logic circuit 11-2 may include a clock circuit generating a plurality of clocks having different phases using a first clock CLKI and a second clock CLKQ. In some example embodiments, the reception circuit may be synchronized with the plurality of clocks to parallelize the data signal DQ received from the host device 12, and the transmission circuit may be synchronized with the plurality of clocks to serialize data to be output to the host device 12, thereby generating the data signal DQ.

The host device 12 may be an operation processing unit such as an application processor, a central processing unit, a system-on-chip, etc. The host device 12 may include a memory controller capable of controlling the memory device 11, and may transmit the data signal DQ to the memory device 11, or receive the data signal DQ from the memory device 11. Also, the host device 12 may transmit the command signal CMD, the address signal ADDR, the first clock CLKI, and the second clock CLKQ to the memory device 11. The first clock CLKI and the second clock CLKQ provided by the host device 12 to the memory device 11 may be external clocks, and may have different phases. In some example embodiments, the first clock CLKI and the second clock CLKQ have the same frequency and the same duty ratio, and the second clock CLKQ may have a phase of 90 degrees later than the first clock CLKI.

Due to a delay difference existing in a signal transmission path between the host device 12 and the memory device 11, a delay occurring in the memory device 11, etc., an error may exist in a phase difference between the plurality of clocks generated by the clock circuit using the first clock CLKI and the second clock CLKQ. In some example embodiments, when the clock circuit generates first to fourth clocks having a phase difference of 90 degrees using the first clock CLKI and the second clock CLKQ, a phase difference between at least some of the clocks may appear to have a degree, different from 90 degrees.

The clock circuit may adjust the phase difference of the first to fourth clocks within a predetermined (or, alternatively, desired, determined, or selected) lock time. In some example embodiments, the clock circuit may adjust the phase difference of the first to fourth clocks by selecting two clocks from the first to fourth clocks and repeating an operation of adjusting a phase difference between the two clocks. In some example embodiments, the clock circuit may adjust the phase difference of the first to fourth clocks by advancing or pushing a time point of a rising edge of the other clock, based on a rising edge of one clock, among selected two clocks.

A lock time may be predetermined (or, alternatively, desired, determined, or selected) in a specification or the like of the memory device 11. Thus, to eliminate an error of a phase difference between first to fourth clocks during the predetermined (or, alternatively, desired, determined, or selected) lock time, the clock circuit needs to effectively adjust phases of the first to fourth clocks.

Figure 11:
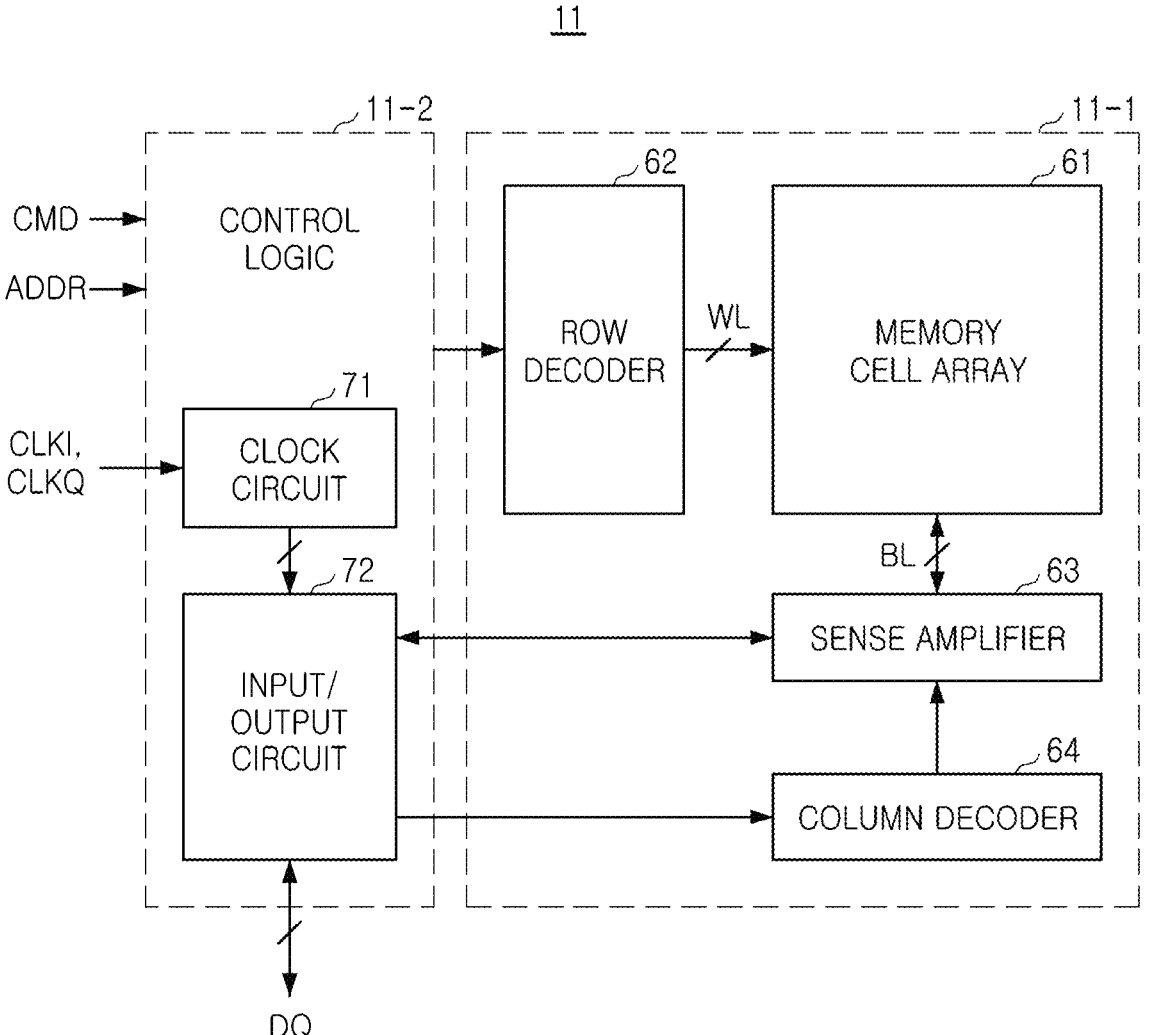
FIG. 11 is a view illustrating the memory device of FIG. 10 in more detail according to some example embodiments.

FIG. 11 is a view illustrating the memory device 11 of FIG. 10 in more detail. Referring to FIG. 11, the memory device 11 may be a storage device based on a semiconductor device. The memory device 11 may store data received through the data signal DQ, or may output the data as the data signal DQ in response to the address signal ADDR and the command signal CMD, received from an external host (e.g., a central processing unit (CPU), an application processor (AP), and a system-on-chip (SoC)).

The memory device 11 may include a plurality of bank regions 11-1. The bank region 11-1 may include a memory cell array 61, a row decoder 62, a sense amplifier 63, a column decoder 64, etc. The memory cell array 61 may include a plurality of memory cells, and the plurality of memory cells may be connected to the row decoder 62 and the sense amplifier 63 through a plurality of wordlines WL and a plurality of bitlines BL. In some example embodiments, each of the plurality of memory cells may be located at a point in which the plurality of wordlines WL and the plurality of bitlines BL cross each other. The plurality of memory cells may be arranged in a matrix form in the memory cell array 61, and each of the plurality of memory cells may include at least one memory element for storing the data. In this case, the memory element may be a volatile memory element or a non-volatile memory element.

The control logic 11-2 may receive the address signal ADDR, the command signal CMD, the first clock CLKI, and the second clock CLKQ from the host. The address signal ADDR may include a row address indicating a row in the memory cell array 61, and a column address indicating a column in the memory cell array 61. In some example embodiments, the row decoder 62 may select at least one of the plurality of wordlines WL with reference to the row address, and the column decoder 64 may select the sense amplifier connected to at least one of the plurality of bitlines BL with reference to the column address.

The sense amplifier 63 may include a plurality of bitline sense amplifiers connected to the memory cell array 61 through the plurality of bitlines BL. When a read operation is executed, a bitline sense amplifier connected to the selected bitline selected by the column decoder 64, among the plurality of bitline sense amplifiers, may read data of at least one cell among memory cells connected to the selected bitline. An input/output circuit 72 of the control logic 11-2 may output the data read by the bitline sense amplifier as the data signal DQ.

The control logic 11-2 may include various logic circuits controlling the bank region 11-1, and, in some example embodiments, may include a clock circuit 71 and an input/output circuit 72. The clock circuit 71 may receive the first clock CLKI and the second clock CLKQ from the external device, for example, a host, and may generate a plurality of clocks based on the first clock CLKI and provide the same to the input/output circuit 72. The input/output circuit 72 may be synchronized with the plurality of clocks to output the data signal DQ, or may extract data from the data signal DQ received from the outside. The clock circuit 71 may include a code generator generating a delay code for adjusting a phase of a clock, a delay circuit adjusting timing of a rising edge or a falling edge of the clock based on the delay code, and a clock tree providing a transmission path of the clock.

Figure 12:
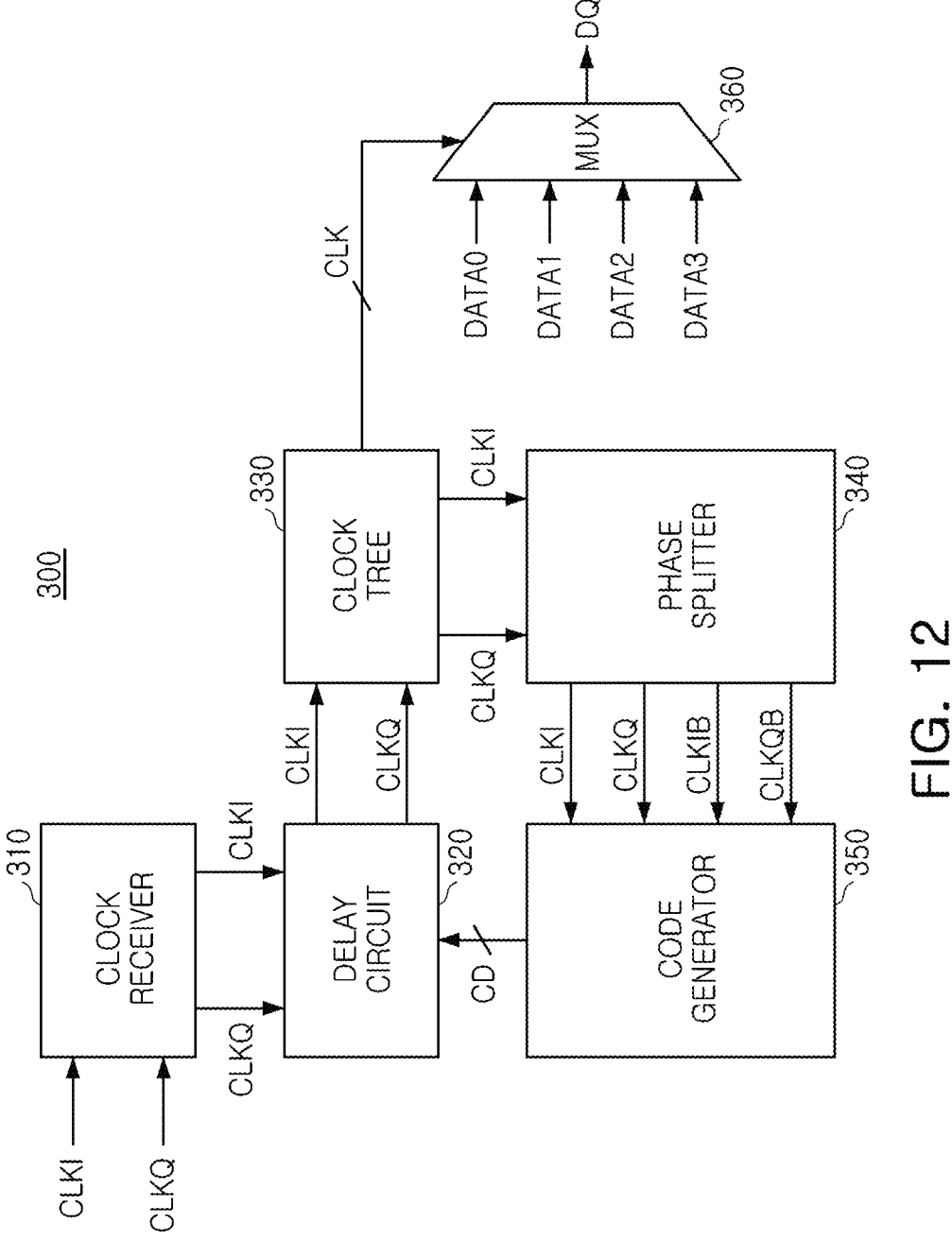
FIG. 12 is a view illustrating a memory device according to some example embodiments.

FIG. 12 is a view illustrating a memory device 300 according to some example embodiments. Referring to FIG. 12, a clock circuit included in a memory device 300 may include a clock receiver 310, a delay circuit 320, a clock tree 330, a phase splitter 340, a code generator 350, and a multiplexer 360. A plurality of clocks CLK output by the clock circuit may be input to the multiplexer 360. The multiplexer 360 may select one of a plurality of internal data signals DATA0 to DATA3 on a rising edge of each of the plurality of clocks CLK, and may output the selected signal as a data signal DQ. Therefore, a speed of the data signal DQ may be higher than speeds of the plurality of internal data signals DATA0 to DATA3.

The clock receiver 310 may include receivers receiving a first clock CLKI and a second clock CLKQ. The first clock CLKI and the second clock CLKQ, received by the clock receiver 310, may be transferred to the delay circuit 320. The delay circuit 320 may adjust timing of at least one of a rising edge and a falling edge in each of the first clock CLKI and the second clock CLKQ. In some example embodiments, the delay circuit 320 may adjust a falling edge of the first clock CLKI, or a rising edge and a falling edge of the second clock CLKQ, based on a delay code CD received from the code generator 350. In this case, a rising edge of the first clock CLKI may not be adjusted as a predetermined (or, alternatively, desired, determined, or selected) reference time point.

The first clock CLKI and the second clock CLKQ output by the delay circuit 320 may be transferred to the phase splitter 340 through the clock tree 330. The clock tree 330 may include at least one repeater for transferring the first clock CLKI and the second clock CLKQ.

The phase splitter 340 may generate the first clock CLKI, the second clock CLKQ, a third clock CLKIB, and a fourth clock CLKQB using the first clock CLKI and the second clock CLKQ. In some example embodiments, the first clock CLKI and the second clock CLKQ may have a phase difference of 90 degrees. The phase splitter 340 may generate the third clock CLKIB which may be a complementary signal of the first clock CLKI, and the fourth clock CLKQB which may be a complementary signal of the second clock CLKQ.

The code generator 350 may select two or more clocks from among the first to fourth clocks CLKI, CLKQ, CLKIB, and CLKQB, and may output the delay code CD for adjusting a phase difference between the selected clocks. In some example embodiments, the code generator 350 may receive clock output signals from among the first to fourth clocks CLKI, CLKQ, CLKIB, and CLKQB. The code generator 350 may compare the clock output signals with each other to generate the delay code. The delay circuit 320 may adjust timing of an edge of the clock CLKI/CLKQ based on a delay code generated in a non-sequential scheme.

Figure 13:
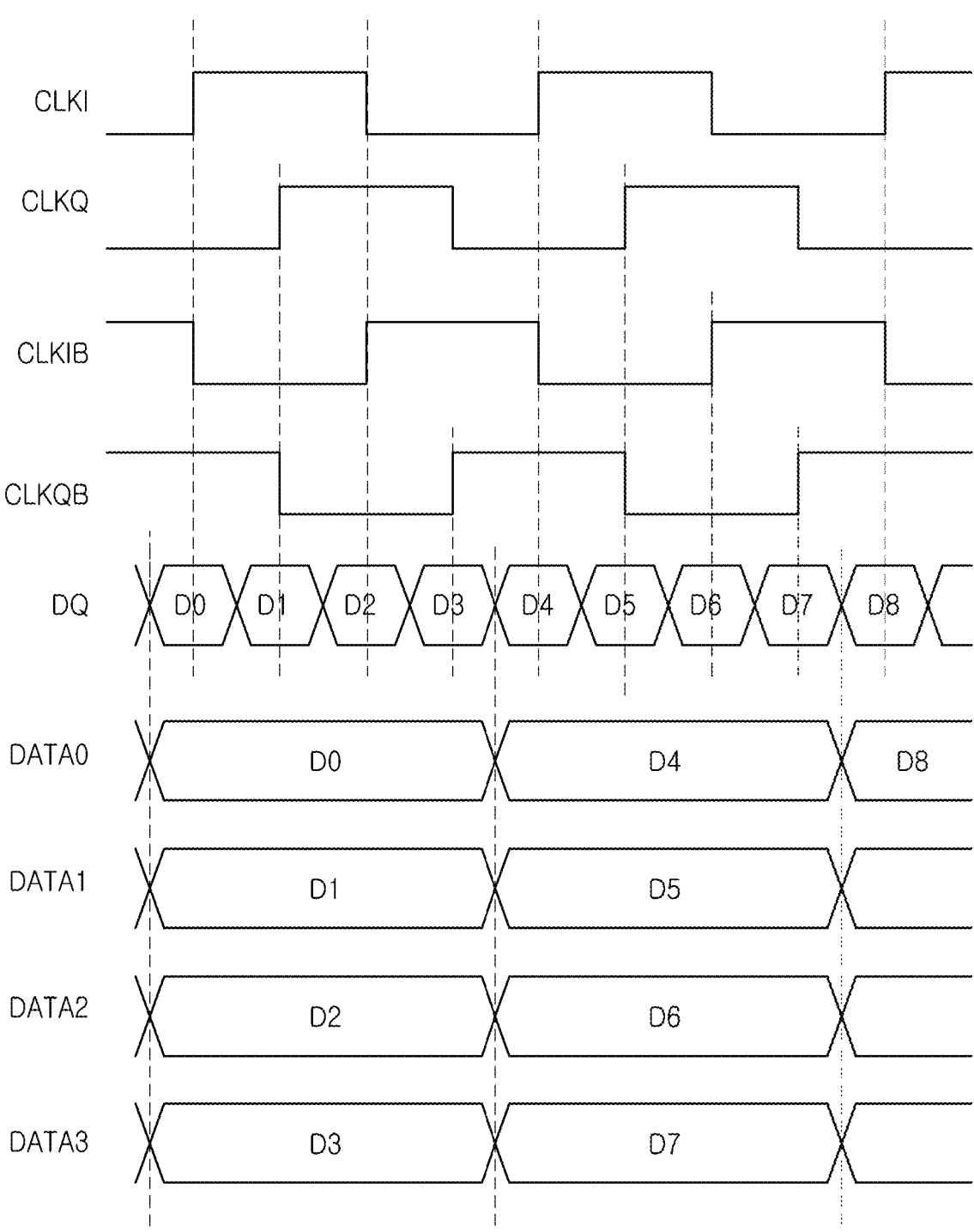
FIG. 13 is a view illustrating an operation of a memory device according to some example embodiments.

FIG. 13 is a view illustrating an operation of a memory device according to some example embodiments. Referring to FIG. 13, an operation of a memory device 300 may be performed as follows. A first clock CLKI, a second clock CLKQ, a third clock CLKIB, and a fourth clock CLKQB may have different phases. In some example embodiments, the first clock CLKI and the second clock CLKQ may have a phase difference of 90 degrees, the first clock CLKI and the third clock CLKIB may have a complementary relationship, and the second clock CLKQ and the fourth clock CLKQB may have a complementary relationship.

A plurality of internal data signals DATA0 to DATA3 generated in the memory device 300 may have the same speed. As described with reference to FIG. 12, a multiplexer 360 may receive the plurality of internal data signals DATA0 to DATA3 and the first to fourth clocks CLKI, CLKQ, CLKIB, and CLKQB, may select one of the plurality of internal data signals DATA0 to DATA3 on a rising edge of each of the first to fourth clocks CLKI, CLKQ, CLKIB, and CLKQB, and may output the selected one as a data signal DQ.

Referring to FIG. 13, first data D0 transmitted as a first internal data signal DATA0 on a first rising edge of the first clock CLKI may be selected and output as the data signal DQ, and second data D1 transmitted as a second internal data signal DATA1 on a first rising edge of the second clock CLKQ may be selected as the data signal DQ. Likewise, on a first rising edge of the third clock CLKIB, third data D2 transmitted as a third internal data signal DATA2 may be output as the data signal DQ, and on a first rising edge of the fourth clock CLKQB, fourth data D3 transmitted as a fourth internal data signal DATA3 may be output as the data signal DQ.

In the present inventive concepts, a quadrature clock may be generated therein using a received external clock CLK.

Figure 14:
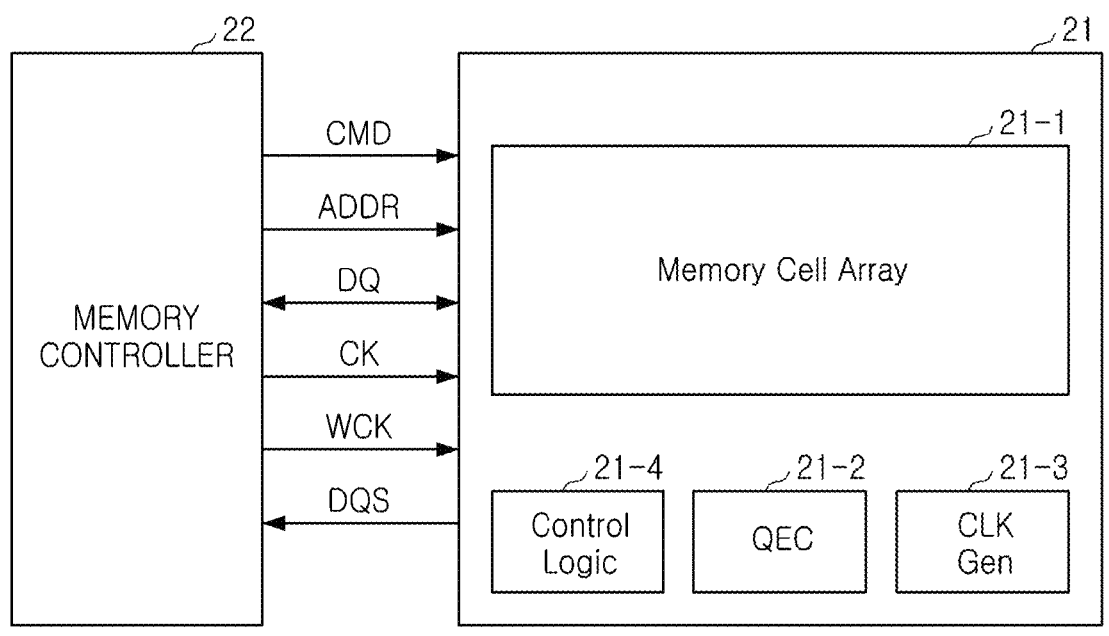
FIG. 14 is a view illustrating a memory system according to some example embodiments.

FIG. 14 is a view illustrating a memory system 20 according to some example embodiments. Referring to FIG. 14, a memory system 20 may include a memory device 21 and a memory controller 22.

The memory device 21 may be used as, for example, an operation memory, a working memory, or a buffer memory in a computing system. In some example embodiments, the memory device 21 may be implemented as a single in-line memory module (SIMM), a dual in-line memory module (DIMM), a small-outline DIMM (SODIMM), an unbuffered DIMM (UDIMM), a fully-buffered DIMM (FBDIMM), a rank-buffered DIMM (RBDIMM), a mini-DIMM, a micro-DIMM, a registered DIMM (RDIMM), or a load-reduced DIMM (LRDIMM). In some example embodiments, the memory device 21 may be implemented as a volatile memory. For example, the volatile memory may include at least one of a dynamic random access memory (DRAM), a synchronous DRAM (SDRAM), a double data rate SDRAM (DDR SDRAM), a low power double data rate SDRAM (LPDDR SDRAM), a graphics double data rate SDRAM (GDDR SDRAM), a rambus DRAM (RDRAM), or a static RAM (SRAM). In another embodiment, the memory device 21 may be implemented as a non-volatile memory. For example, the non-volatile memory may include any one of a NAND flash memory, a phase-change RAM (PRAM), a magneto-resistive RAM (MRAM), a resistive RAM (RcRAM), a ferro-electric RAM (FRAM), or a NOR flash memory.

The memory controller 22 may entirely control an operation of the memory system 20, and may entirely control exchange of data between an external host and the memory device 21. For example, the memory controller 22 may control the memory device 21 according to a request from the host to write or read data. Also, the memory controller 22 may apply operation commands for controlling the memory device 21 to control an operation of the memory device 21.

The memory controller 22 may transmit a clock CK (or a command clock), a command CMD, and an address ADDR to the memory device 21. The memory controller 22 may provide a data clock WCK to the memory device 21 when writing a data signal DQ in the memory device 21 or reading the data signal DQ from the memory device 21. When transmitting the data signal DQ to the memory controller 22, the memory device 21 may provide a strobe signal DQS, together with the data signal DQ, to the memory controller 22.

The memory device 21 may include a memory cell array 21-1 in which the data signal DQ is stored, a quadrature error correction circuit (QEC) 21-2, a clock generation circuit (CLK Gen) 21-3, and a control logic 21-4. The control logic 21-4 may control an operation of the memory device 21. The QEC 21-2 may simultaneously adjust a skew and a duty error of an input clock QEC IN having a phase difference of 90 degrees, generated based on the data clock WCK, to generate a correction clock QEC_OUT having a phase difference of 90 degrees. Also, the QEC 21-2 may be implemented to perform phase error correction in a non-sequential scheme, as described in FIGS. 1 to 13. The clock generation circuit 21-3 may generate an output clock and the strobe signal DQS, based on the correction clock QEC_OUT.

Figure 15:
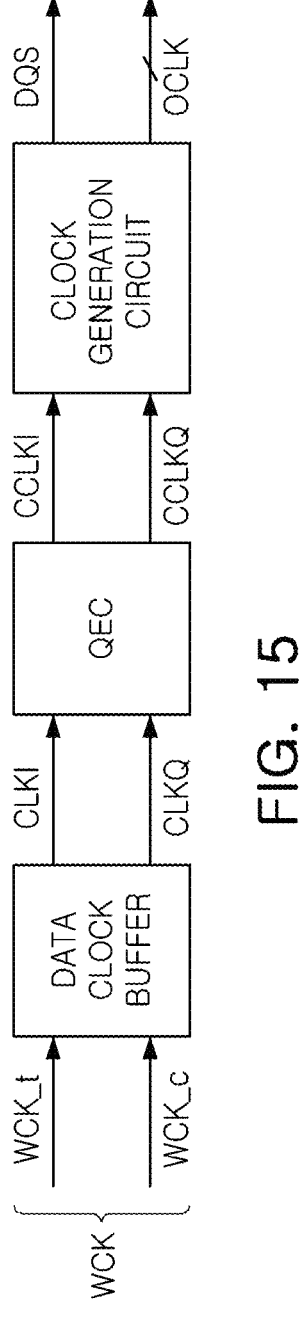
FIG. 15 is a view illustrating a method of generating a strobe signal of a memory device according to some example embodiments.

FIG. 15 is a view illustrating a method of generating a DQS signal of a memory device according to some example embodiments. A data clock buffer may receive a data clock WCK including a pair of differential clocks WCK_c and WCK_t, may generate a first clock CLKI (in-phase clock) and a second clock CLKQ (orthogonal phase clock) having a phase difference of 90° based on the data clock WCK, and may provide the first clock CLKI and the second clock CLKQ to a QEC. The QEC may correct a skew between the first clock CLKI and the second clock CLKQ and a duty error of the first clock CLKI and the second clock CLKQ, may generate corrected clocks CCLKI and CCLKQ having a phase difference of 90°, and may provide them to a clock generation circuit. The clock generation circuit may generate an output clock OCLK and a strobe signal DQS, based on the corrected clocks CCLKI and CCLKQ, and may provide the output clock OCLK and the strobe signal DQS to a data input/output buffer. The output clock may be a plurality of clocks having different phases.

A control logic 21-4 may control an operation of a memory device 21. For example, the control logic 21-4 may generate control signals such that the memory device 21 performs a write operation or a read operation. The control logic 21-4 may include a command decoder decoding a command CMD received from a memory controller 22, and a mode register setting an operation mode of the memory device 21.

Figure 16:
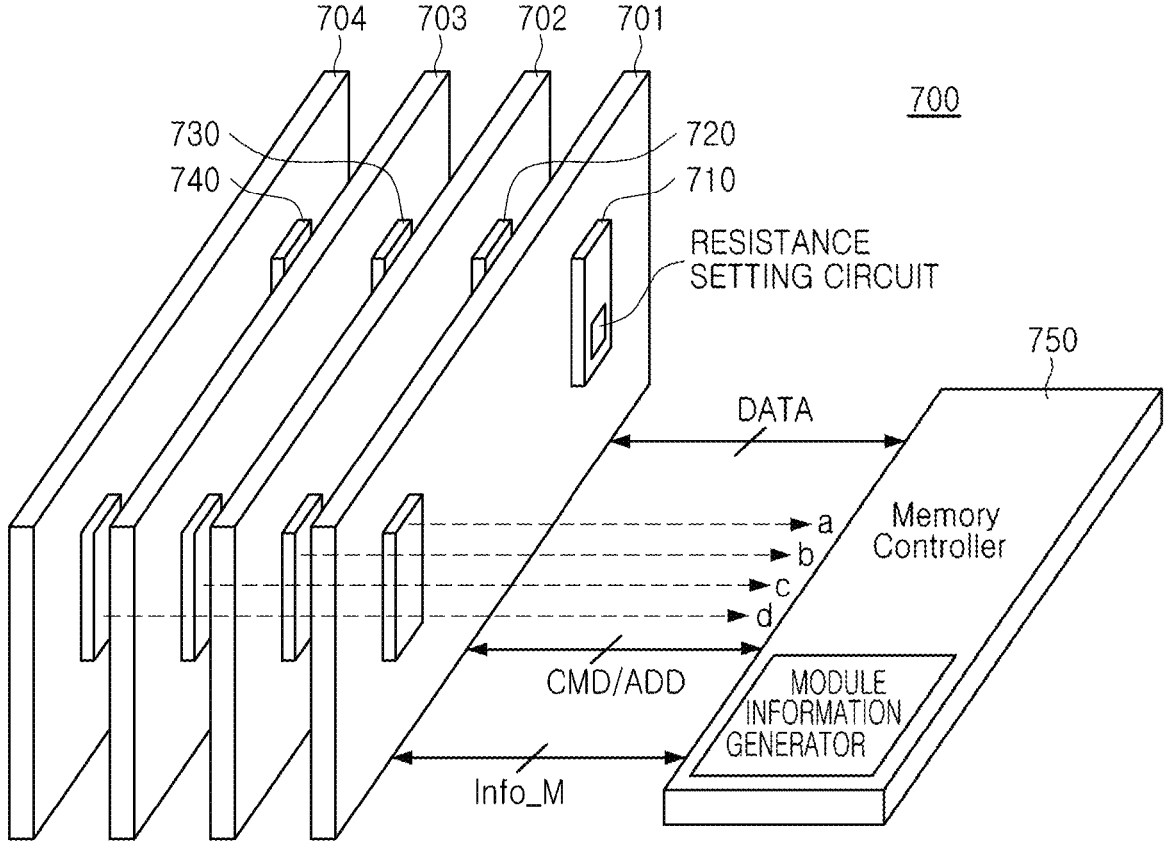
FIG. 16 is a view illustrating a memory system according to some example embodiments.

FIG. 16 is a view illustrating a memory system 700 according to some example embodiments. Referring to FIG. 16, a memory system 700 may include a plurality of memory modules 701 to 704 and a memory controller 750.

Each of the plurality of memory modules 701 to 704 may be implemented to control clock/data delay, slew, or driving strength of a transmission line according to a data pattern when transmitting data. The plurality of memory modules 701 to 704 may include at least one memory device performing QEC in a non-sequential scheme, as described in FIGS. 1 to 15.

In some example embodiments, each of the memory modules 701 to 704 may be implemented in the form of a single in-line memory module (SIMM) or a dual in-line memory module (DIMM). In some example embodiments, the memory modules 701 to 704 and the memory controller 750 may be mounted on a system board to transmit and receive data DATA and command/address CMD/ADD through wiring on the system board. The memory devices included in the memory system 700 may constitute a plurality of ranks RANK. In some example embodiments, memory devices mounted on different memory modules may be defined as being included in different ranks RANK. Alternatively, among memory devices mounted on the same memory module, a memory device mounted on one surface of a module board and a memory device mounted on the other surface thereof may be defined as being included in different ranks RANK. The memory modules 701 to 704 may be mounted at different positions on the system board, and accordingly, the memory devices of different ranks RANK may transmit and receive the data DATA to and from the memory controller 750 in different physical distances.

In some example embodiments, resistances of a data (DATA) transmission path between the memory modules 701 to 704 and the memory controller 750 may be different from each other. In some example embodiments, a physical distance between a first memory module 701 and the memory controller 750 may be relatively short, while a physical distance between a fourth memory module 704 and the memory controller 750 may be relatively long. Therefore, a training operation according to a data pattern may be performed for each of the memory modules, and optimal timing control may be performed before data transmission according to a result of performance.

In some example embodiments, the memory device described in FIGS. 1 to 15 may be implemented as a multilayer memory device.

Figure 17:
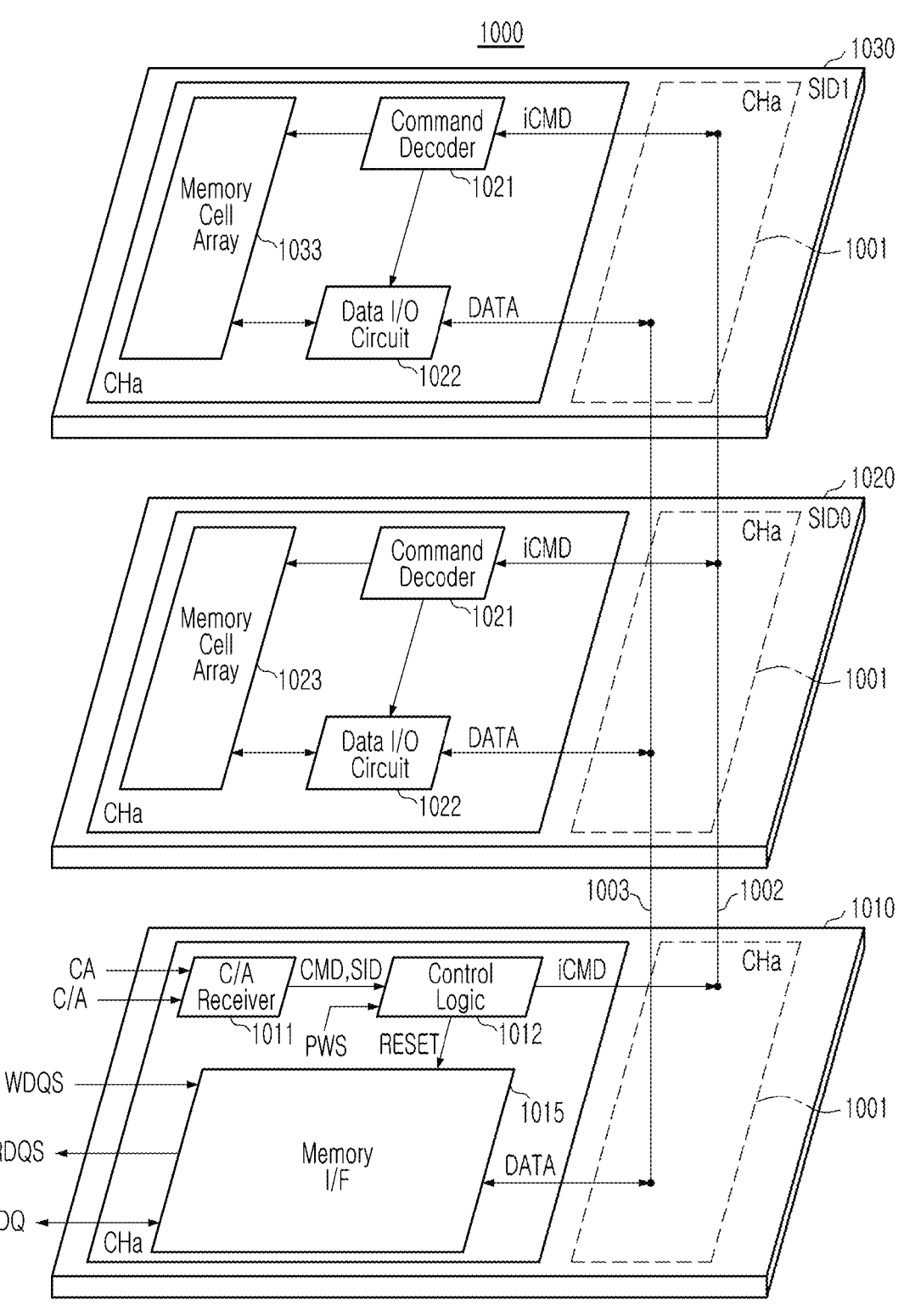
FIG. 17 is a view illustrating a multilayer memory device according to some example embodiments.

FIG. 17 is a view illustrating a multilayer memory device 1000 according to some example embodiments. Referring to FIG. 17, a multilayer memory device 1000 may include a buffer die 1010, a first core die 1020, and a second core die 1030. The first core die 1020 and the second core die 1030 may support the same channel CHa among a plurality of channels. In this case, the core dies 1020 and 1030 may be identified by a stack ID SID. For example, the first core die 1020 may correspond to a first stack ID SID0, and the second core die 1030 may correspond to a second stack ID SID1. Although no core die is illustrated as being provided between the first core die 1020 and the second core die 1030, a different core die may be located between the first core die 1020 and the second core die 1030.

The buffer die 1010 and the core dies 1020 and 1030 may communicate through TSVs 1002 and 1003 located in a TSV region 501. For example, the buffer die 1010 may transmit an internal command iCMD to the first core die 1020 or the second core die 1030 through the TSV 1002, and may transmit and receive data DATA to and from the first core die 1020 or the second core die 1030 through the TSV 1003. As illustrated in FIG. 17, although the buffer die 1010 is illustrated to communicate with the core dies 1020 and 1030 using the same TSVs 1002 and 1003, but the buffer die 1010 may communicate using a separate TSV corresponding to each of the core dies 1020 and 1030.

The second core die 1030 may include a command decoder 1031, a data input/output circuit 1032, and a memory cell array 1033. The command decoder 1031, the data input/output circuit 1032, and the memory cell array 1033 may operate in a manner, substantially the same as a command decoder 1021, a data input/output circuit 1022, and a memory cell array 1023 of the first core die 1020.

A C/A receiver 1011 may latch a command/address signal C/A based on a clock CK, to receive a command CMD and a stack ID SID. The stack ID SID may be an address representing at least one core die to distinguish core dies supporting the same channel. The received command CMD and the stack ID SID may be provided to a control logic circuit 1012.

The control logic circuit 1012 may transmit the internal command iCMD to at least one of the first core die 1020 or the second core die 1030, based on the stack ID SID. For example, when the stack ID SID indicates the first stack ID SID0, the control logic circuit 1012 may transmit the internal command iCMD to the first core die 1020.

In some example embodiments, as illustrated in FIG. 17, when an internal command iCMD and data DATA are transmitted to the core dies 1020 and 1030 through the common TSVs 1002 and 1003, the buffer die 1010 may transmit the stack ID SID to the core dies 1020 and 1030. The core dies 1020 and 1030 may decode the transmitted stack ID SID, and may selectively receive the internal command iCMD and the data DATA. For example, when the stack ID SID indicates the first stack ID SID0, the first core die 1020 may receive the internal command iCMD and the data DATA transmitted through the TSVs 1020 and 1030. In this case, the second core die 1030 may not receive the internal command iCMD and the data DATA transmitted through the TSVs 1020 and 1030.

In some example embodiments, when an internal command iCMD and data DATA are transmitted to the core dies 1020 and 1030 through a separate TSV, the buffer die 1010 may transmit the internal command iCMD and the data DATA to a core die corresponding to the stack ID through the separate TSV. As described above, when the core dies 1020 and 1030 support the same channel CHa, the multilayer memory device 1000 may perform a write operation and a read operation according to an active command or a refresh operation by a refresh command, based on at least one of the first core die 1020 or the second core die 1030 according to the stack ID SID.

In some example embodiments, the present inventive concepts may be implemented as a semiconductor package.

Figure 18:
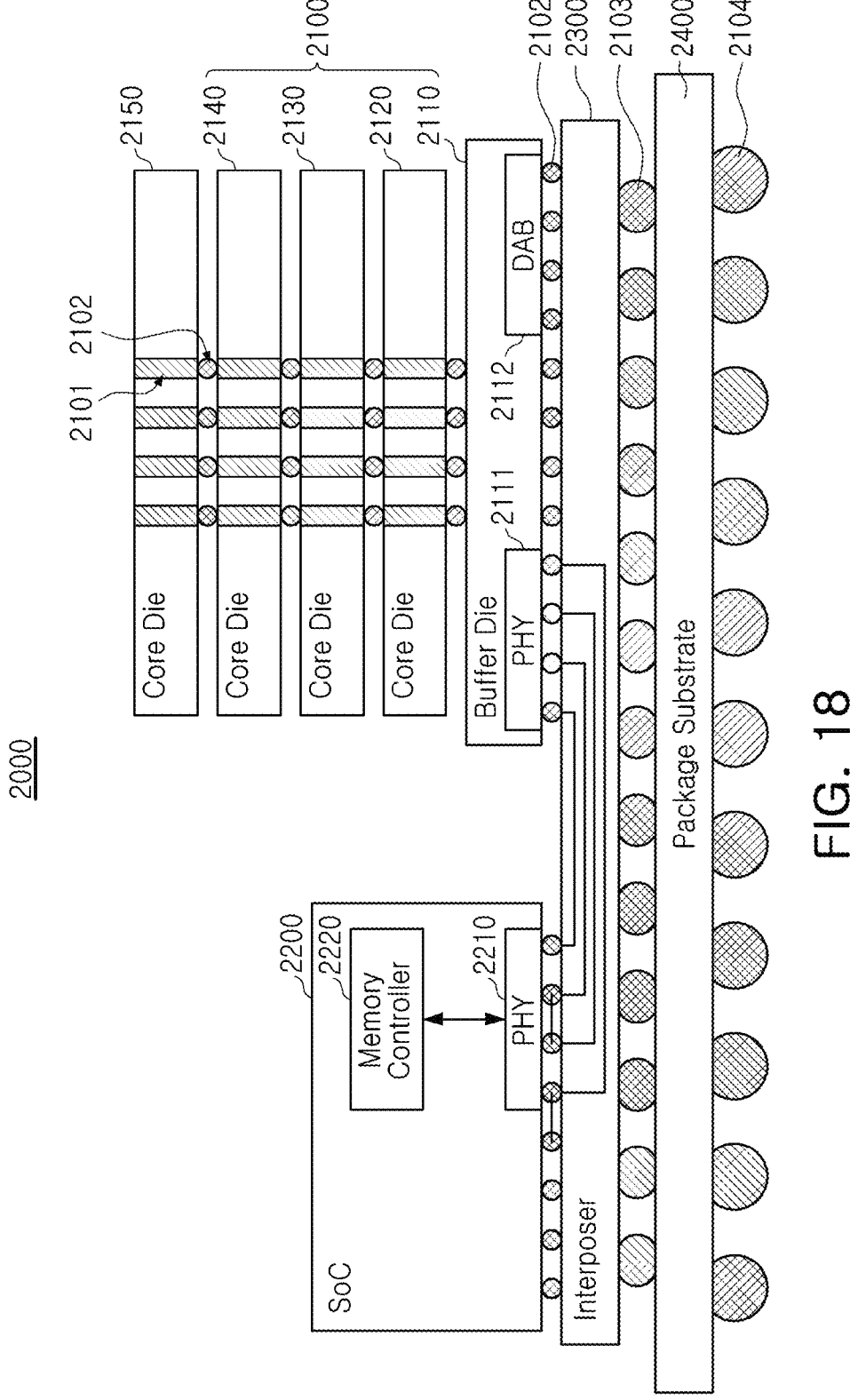
FIG. 18 is a view illustrating a semiconductor package according to some example embodiments.

FIG. 18 is a view illustrating a semiconductor package 2000 according to some example embodiments. Referring to FIG. 18, a semiconductor package 2000 may include a multilayer memory device 2100, a system-on-chip 2200, an interposer 2300, and a package substrate 2400. The multilayer memory device 2100 may include a buffer die 2110 and core dies 2120 to 2150. In some example embodiments, the multilayer memory device 2100 may include at least one memory device performing QEC, as described in FIGS. 1 to 15. Each of the core dies 2120 to 2150 may include a memory cell array. The buffer die 2110 may include a physical layer 2111 and a direct access region DAB or 2112. The physical layer 2111 may be electrically connected to a physical layer 2210 of the system-on-chip 2200 through the interposer 2300. The multilayer memory device 2100 may receive signals from the system-on-chip 2200 through the physical layer 2111, or may transmit signals to the system-on-chip 2200. The physical layer 2111 may include interface circuits of the buffer die 2110.

The direct access region 2112 may provide an access path through which the multilayer memory device 2100 is tested without passing through the system-on-chip 2200. The direct access region 2112 may include a conductive means (for example, a port or a pin) capable of directly communicating with an external test device. A test signal and data received through the direct access region 2112 may be transmitted to the core dies 2120 to 2150 through TSVs. Data read from the core dies 2120 to 2150 for the test of the core dies 2120 to 2150 may be transmitted to a test device through the TSVs and the direct access region 2112. Therefore, a direct access test may be performed on the core dies 2120 to 2150. The buffer die 2110 and the core dies 2120 to 2150 may be electrically connected to each other through TSVs 2101 and bumps 2102. The buffer die 2110 may receive signals provided to each channel from the system-on-chip 2200 through the bumps 2102 allocated for each channel. For example, the bumps 2102 may be microbumps.

The system-on-chip 2200 may execute applications supported by the semiconductor package 2000 using the multilayer memory device 2100. For example, the system-onchip 2200 may include a central processing unit (CPU), an application processor (AP), a graphic processing unit (GPU), a neural processing unit (NPU), a tensor processing unit (TPU), a vision processing unit (VPU), an image signal processor (ISP), or a digital signal processor (DSP) to execute specialized operations. The system-on-chip 2200 may include a physical layer 2210 and a memory controller 2220. The physical layer 2210 may include input/output circuits for transmitting and receiving signals to and from the physical layer 2111 of the multilayer memory device 2100. The system-on-chip 2200 may provide various signals to the physical layer 2111 through the physical layer 2210. The signals provided to the physical layer 2111 may be transmitted to the core dies 2120 to 2150 through interface circuits of the physical layer 2111 and the TSVs 2101.

The memory controller 2220 may entirely control an operation of the multilayer memory device 2100. The memory controller 2220 may transmit signals for controlling the multilayer memory device 2100 to the multilayer memory device 2100 through the physical layer 2210. The interposer 2300 may connect the multilayer memory device 2100 with the system-on-chip 2200. The interposer 2300 may connect the physical layer 2111 of the multilayer memory device 2100 with the physical layer 2210 of the system-on-chip 2200, and may provide physical paths formed by using conductive materials. Therefore, the multilayer memory device 2100 and the system-on-chip 2200 may be stacked on the interposer 2300 to transmit and receive signals to and from each other.

Bumps 2103 may be attached to an upper portion of the package substrate 2400, and a solder ball 2104 may be attached to a lower portion of the package substrate 2400. For example, the bumps 2103 may be flip-chip bumps. The interposer 2300 may be stacked on the package substrate 2400 through the bumps 2103. The semiconductor package 2000 may transmit and receive signals to and from other external packages or semiconductor devices through the solder ball 2104. For example, the package substrate 2400 may be a printed circuit board (PCB).

In some example embodiments, the present inventive concepts may be applied to a high band memory (HBM) package.

Figure 19:
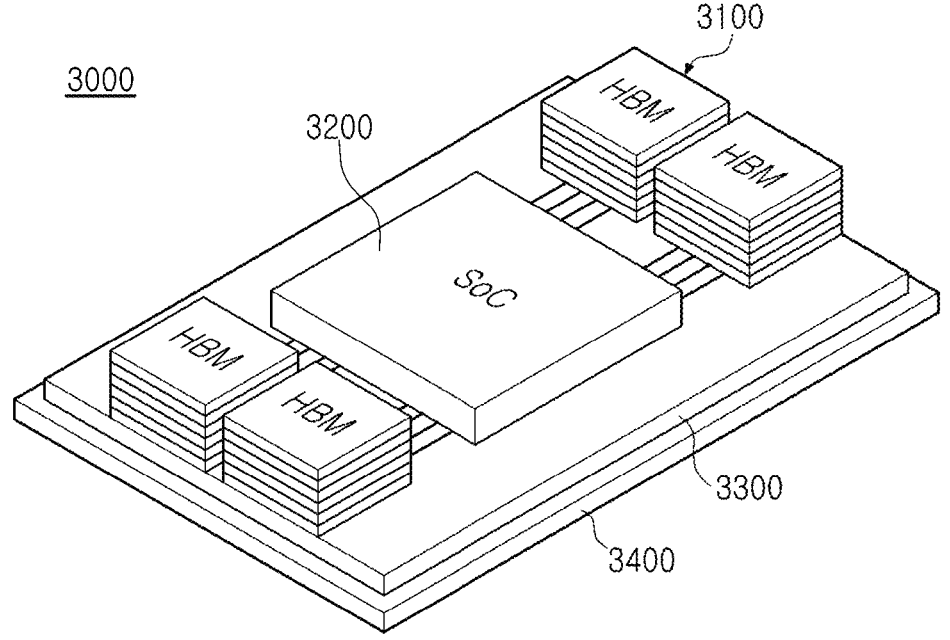
FIG. 19 is a view illustrating an HBM package according to some example embodiments.

FIG. 19 is a view illustrating an HBM package 3000 according to some example embodiments. Referring to FIG. 19, an HBM package 3000 may include a plurality of multilayer memory devices 3100 and a system-on-chip 3200.

Each of a plurality of multilayer memory devices 3100 may be implemented to perform QEC in a non-sequential scheme, as described with reference to FIGS. 1 to 15. The multilayer memory devices 3100 and the system-on-chip 3200 may be stacked on an interposer 3300, and the interposer 3300 may be stacked on a package substrate 3400. The HBM package 3000 may transmit and receive signals to and from other external packages or semiconductor devices through a solder ball attached to a lower portion of the package substrate 3400. Each of the multilayer memory devices 3100 may be implemented based on the HBM standard. However, the present inventive concepts are not limited thereto, and each of the multilayer memory devices 3100 may be implemented based on a GDDR (Graphic Double Data Rate), a HMC (Hybrid Memory Cube), or a Wide I/O standard.

The system-on-chip 3200 may include at least one processor, such as a CPU (Central Processing Unit), an AP (Application Processor), a GPU (Graphic Processing Unit), a DPU (Data Processing Unit), an NPU (Neural network Processing Unit), etc., and a plurality of memory controllers controlling the plurality of multilayer memory devices 3100. The system-on-chip 3200 may transmit and receive signals to and from a multilayer memory device corresponding thereto through a memory controller.

The device described above may be implemented with a hardware component, a software component, and/or a combination of the hardware component and the software component. For example, a device and a component, described in some example embodiments, may be implemented using a processor, a controller, an artificial logic unit (ALU), a digital signal processor, a microcomputer, a field programmable gate array (FPGA), a microprocessor, or one or more general-purpose computers or special-purpose computers, such as any other device capable of executing and responding to instructions. A processing device may perform an operating system (OS) and one or more software applications executed on the operating system. In addition, the processing device may access, store, manipulate, process, and generate data in response to execution of the software. For convenience of understanding, one processing device may be described as being used, but those skilled in the art may see that the processing device may include a plurality of processing elements or a plurality of types of processing elements. For example, the processing device may include a plurality of processors or one processor and one controller. In addition, other processing configurations, such as a parallel processor, is possible.

The software may include a computer program, a code, an instruction, or a combination of one or more thereof, and may configure the processing device to operate as desired, or may command the processing device independently or collectively. The software and/or the data may be embodied in any type of machine, component, physical device, virtual device, computer storage medium, or device, to be interpreted by the processing device or to provide a command or data to the processing device. The software may be distributed on a networked computer system, stored, or executed in a distributed manner. The software and the data may be stored or stored on one or more computer-readable recording media.

A memory device and an operating method thereof according to some example embodiments may correct a phase error in quadrature clock (4-phase clock). A memory device and an operating method thereof according to some example embodiments may correct a phase error faster and more accurately than a sequential scheme. A memory device according to some example embodiments may be implemented by a delay line, an MUX, a bang-bang phase detector (BBPD), a buffer, and a control logic circuit. Since the memory device of the present inventive concepts uses one loop, a phase error in quadrature clock may be accurately corrected to 0 regardless of a mismatch.

In a general QEC, since independent two phase errors are corrected at the same time through unrolling, a fast lock time close to ½ times, as compared to the sequential scheme, may be achieved. The sequential scheme QEC does not have a mismatch issue using one loop, but correction of the phase errors may be sequentially performed with I-Q→Q-IB→IB-QB→QB-I. In this case, a long lock time may be required because at least one cycle should be waited until the next phase error correction sequence due to the QEC loop latency passing through the delay line, the buffer, the MUX, etc. after the delay code update. A general QEC may achieve a lock time of ½ level, as compared to the sequential scheme, through unrolling, but as a result, two BBPDs may be used, resulting in a phase error due to the mismatch solved in the sequential scheme.

In implementing the present inventive concepts, there may be no portion to be significantly modified in the existing DRAM interface and I/O. The present inventive concepts may be applied to a design of a high-speed next-generation memory interface, and may be applied even when the number of clock phases used in the interface increases due to an increase in clock speed, and thus may be configured as 8 or more-phase clock.

The present inventive concepts may be a circuit design in a DRAM interface, and may significantly improve a lock time without offset problems while using QEC.

The present inventive concepts discloses a fast four-phase clock error corrector using a non-sequential algorithm. In this case, the phase error detection order may be in a non-sequential scheme to simultaneously perform delay line update and independent phase error detection, to minimize a wait cycle due to the delay line update, and reduce the lock time onto a level of ⅝, as compared to the existing QEC. In addition, since the QEC of the present inventive concepts uses one loop, it may be robust (no offset problem) to mismatch.

The present inventive concepts discloses a technology for detecting and correcting a phase error of a quadrature clock using a non-sequential algorithm. In some example embodiments, QEC technology of the present inventive concepts may simultaneously detect a delay update of a delay line and an unrelated phase error. The QEC technology of the present inventive concepts may reduce a waiting time and a lock time of the QEC by continuously detecting a phase error of a quadrature clock while using one phase detector.

A memory device, a memory system having the same, and an operating method thereof, according to the present inventive concepts, may correct a quadrature error in a non-sequential scheme while using a single phase detector.

A memory device, a memory system having the same, and an operating method thereof, according to the present inventive concepts, may correct a quadrature error in a non-sequential scheme while using a single phase detector, to perform error correction quickly and accurately while reducing a chip size.

As described herein, any electronic devices and/or portions thereof according to any of the example embodiments may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a DRAM device, storing a program of instructions, and a processor (e.g., CPU) configured to execute the program of instructions to implement the functionality and/or methods performed by some or all of any devices, systems, modules, units, controllers, circuits, architectures, and/or portions thereof according to any of the example embodiments, and/or any portions thereof.

While example embodiments have been illustrated and described above, it will be apparent to those skilled in the art that modifications and variations could be made without departing from the scope of the present inventive concepts as defined by the appended claims.

What is claimed is:

1. A method of operating a memory device, comprising:
receiving a first clock, a second clock, a third clock, and a fourth clock, having a sequential phase difference;
updating a first delay code corresponding to a first delay line while detecting a first phase difference between the third clock and the fourth clock during a first clock cycle;
updating a fourth delay code corresponding to a fourth delay line according to the first phase difference while detecting a second phase difference between the second clock and the third clock during a second clock cycle;
updating a third delay code corresponding to a third delay line according to the second phase difference while detecting a third phase difference between the first clock and the second clock during a third clock cycle;
updating a second delay code corresponding to the fourth delay line according to the third phase difference during a fourth clock cycle; and
detecting a fourth phase difference between the fourth clock and the first clock during a fifth clock cycle.

2. The method of claim 1, wherein the first to fourth clocks are quadrature clocks in which the sequential phase difference is 90°.

3. The method of claim 1, further comprising:
selecting the third clock and the fourth clock during the first clock cycle; and
outputting the first phase difference between the third clock and the fourth clock during the first clock cycle.

4. The method of claim 1, further comprising:
selecting the second clock and the third clock during the second clock cycle; and
outputting the second phase difference between the second clock and the third clock during the second clock cycle.

5. The method of claim 1, further comprising:
selecting the first clock and the second clock during the third clock cycle; and
outputting the third phase difference between the first clock and the second clock during the third clock cycle.

6. The method of claim 1, wherein detection of a clock phase difference during the fourth clock cycle is on a wait.

7. The method of claim 6, wherein the second delay code is updated while the third phase difference is output.

8. The method of claim 1, further comprising:
selecting the fourth clock and the first clock during the fifth clock cycle; and
outputting the fourth phase difference between the fourth clock and the first clock during the fifth clock cycle.

9. The method of claim 1, further comprising, after detecting the fourth phase difference, updating the first delay code corresponding to the first delay line according to the fourth phase difference.

10. The method of claim 1, further comprising selecting at least two of the first to fourth clocks by a multiplexer.

11. A memory device comprising:
a first clock line, a second clock line, a third clock line, and a fourth clock line, respectively outputting a first clock, a second clock, a third clock, and a fourth clock, having a sequential phase difference;

a multiplexer configured to select a first clock output signal and a second clock output signal from the first to fourth clock lines in response to a select signal;

a first delay line configured to receive the first clock output signal;

a second delay line configured to receive the second clock;

a third delay line configured to receive the third clock;

a fourth delay line configured to receive the fourth clock;

a phase detector configured to detect a phase difference between a clock delayed through the first delay line and a clock of the second clock output signal; and a digital logic configured to generate a delay code corresponding to the phase difference and control a delay line corresponding to the delay code, among the first to four delay lines, the digital logic configured to generate the select signal to select two clocks, among the first to fourth clocks, in a non-sequential scheme.

12. The memory device of claim 11, wherein the digital logic is configured to select the third clock and the fourth clock during a first clock cycle, select the second clock and the third clock during a second clock cycle, select the first clock and the second clock during a third clock cycle, wait during a fourth clock cycle, and generate the select signal to select the fourth clock and the first clock during a fifth clock cycle.

13. The memory device of claim 12, wherein the digital logic is configured to update a first delay code corresponding to the first delay line according to a first phase difference between the third clock and the fourth clock during the first clock cycle, update a fourth delay code corresponding to the fourth delay line according to a second phase difference between the second clock and the third clock during the second clock cycle, update a third delay code corresponding to the third delay line according to a third phase difference between the first clock and the second clock during the third clock cycle, update a second delay code corresponding to the fourth delay line according to the third phase difference during the fourth clock cycle, and detect a fourth phase difference between the fourth clock and the first clock during the fifth clock cycle.

14. The memory device of claim 13, wherein the digital logic is configured to, after detecting the fourth phase difference, update the first delay code corresponding to the first delay line according to the fourth phase difference.

15. The memory device of claim 11, wherein the first to fourth clocks are used as data strobe signals.

16. A memory system comprising:

at least one memory device; and a memory controller configured to control the at least one memory device, the at least one memory device including a memory cell array having memory cells connected to wordlines and bitlines;

a quadrature error correction circuit configured to receive a quadrature clock and correct the quadrature clock;

a clock generator configured to generate the corrected quadrature clock as an internal clock; and a control logic configured to control write and read operations of the memory cell array, the quadrature error correction circuit is configured to correct the quadrature clock in a non-sequential scheme with one phase detector.

17. The memory system of claim 16, wherein the quadrature error correction circuit is configured to receive the quadrature clock from the memory controller.

18. The memory system of claim 16, wherein the at least one memory device is configured to generate the quadrature clock based on a clock received from the memory controller.

19. The memory system of claim 16, wherein the quadrature clock comprises a first clock, a second clock, a third clock, and a fourth clock, having a sequential phase, and the quadrature error correction circuit is configured to update a first delay code corresponding to a first delay line while detecting a first phase difference between the third clock and the fourth clock during a first clock cycle;

update a fourth delay code corresponding to a fourth delay line according to the first phase difference while detecting a second phase difference between the second clock and the third clock during a second clock cycle;

update a third delay code corresponding to a third delay line according to the second phase difference while detecting a third phase difference between the first clock and the second clock during a third clock cycle;

update a second delay code corresponding to the fourth delay line according to the third phase difference during a fourth clock cycle; and detect a fourth phase difference between the fourth clock and the first clock during a fifth clock cycle.

20. The memory system of claim 19, wherein the quadrature error correction circuit further comprises a multiplexer configured to select at least two clocks among the first to fourth clocks, the one phase detector is configured to detect a phase difference between the at least two clocks selected by the multiplexer, and the quadrature error correction circuit is configured to control a delay line corresponding thereto according to the phase difference.

* * * * *